(12) United States Patent
Ishikawa

(10) Patent No.: US 7,495,297 B2
(45) Date of Patent: *Feb. 24, 2009

(54) SEMICONDUCTOR DEVICE AND METHOD FOR MANUFACTURING THE SAME

(75) Inventor: Atsushi Ishikawa, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/009,160

(22) Filed: Jan. 16, 2008

(65) Prior Publication Data

US 2008/0128804 A1  Jun. 5, 2008

Related U.S. Application Data

(63) Continuation of application No. 11/249,567, filed on Oct. 13, 2005, now Pat. No. 7,345,348.

(30) Foreign Application Priority Data

Nov. 30, 2004 (JP) ............................. 2004-346400

(51) Int. Cl.
*H01L 27/088* (2006.01)
(52) U.S. Cl. ...................................... 257/401; 257/408
(58) Field of Classification Search ................. 257/401, 257/408, 365
See application file for complete search history.

(56) References Cited

U.S. PATENT DOCUMENTS

| 6,489,657 | B1 | 12/2002 | Mori |
| 7,091,656 | B2 * | 8/2006 | Sutardja ....................... 257/401 |
| 7,345,348 | B2 * | 3/2008 | Ishikawa ...................... 257/401 |

(Continued)

FOREIGN PATENT DOCUMENTS

JP  06-045602  2/1994

(Continued)

OTHER PUBLICATIONS

Communication from Korean Patent Office regarding counterpart application, Nov. 27, 2006.

*Primary Examiner*—Mark Prenty
(74) *Attorney, Agent, or Firm*—Harness, Dickey & Pierce, P.L.C.

(57) ABSTRACT

A semiconductor device, comprising: a first transistor of a second electric conductivity type formed in a substrate including impurities of a first electric conductivity type; and a second transistor of the second electric conductivity type formed in the substrate, a source region of the second transistor being shared with a source region of the first transistor; wherein in a lower layer of a gate insulating film of the first transistor, a first offset layer of the second electric conductivity type is formed adjacent to a channel region of the first transistor, in a lower layer of a gate insulating film of the second transistor, a second offset layer of the second electric conductivity type is formed adjacent to a channel region of the second transistor, and in the source region, a first diffusion layer of the first electric conductivity type and a second diffusion layer of the first electric conductivity type in the upper layer of the first diffusion layer are formed, and wherein the second diffusion layer is provided so as to come in contact with the first and second offset layers via the first diffusion layer, and the impurity concentration of the first diffusion layer is higher than the impurity concentration of the substrate.

13 Claims, 26 Drawing Sheets

U.S. PATENT DOCUMENTS

2006/0113609 A1 6/2006 Ishikawa

FOREIGN PATENT DOCUMENTS

| | | |
|---|---|---|
| JP | 2746175 | 2/1998 |
| JP | 10-093020 | 4/1998 |
| JP | 2001-196546 | 7/2001 |
| KR | 10-0189038 | 1/1999 |
| KR | 10-0261899 | 4/2000 |

* cited by examiner

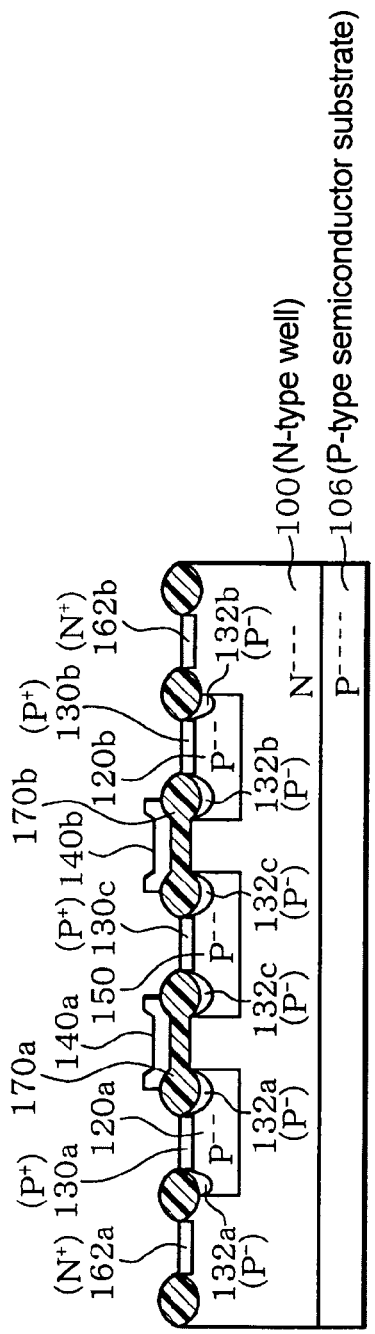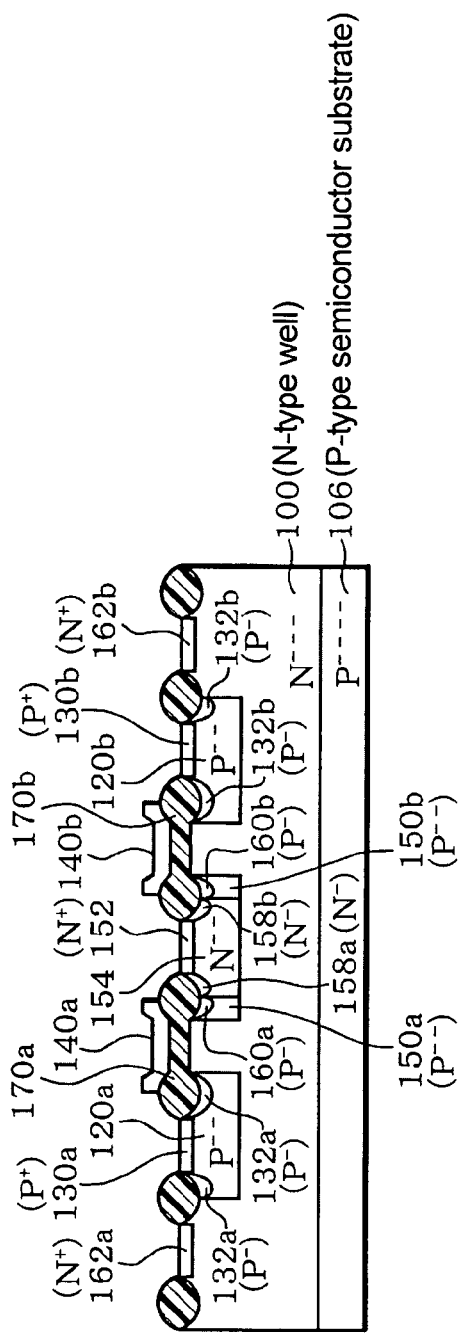
FIG.12A
FIG.12B

SEMICONDUCTOR DEVICE AND METHOD FOR MANUFACTURING THE SAME

CROSS REFERENCE TO RELATED APPLICATIONS

This application is a continuation of patent application U.S. Ser. No. 11/249,567 filed Oct. 13, 2005, claiming priority to Japanese Patent Application Nos. 2004-346400 filed Nov. 30, 2004 all of which are incorporated by reference.

BACKGROUND OF THE INVENTION

1. Technical Field

The present invention relates to semiconductor devices and a method for manufacturing the same.

2. Related Art

Conventionally, fluorescent display tubes (Vacuum Fluorescence Display: VFD) are used as a display device in home electric appliances on-vehicle instruments and the like. This fluorescent display tube carries out display operation with an electrooptic effect similar to that of CRT (Cathode Ray Tube). While a high voltage of, for example, 10K volt is required for the display operation of CRT, a voltage of, for example, several tens of volts. is required for the display operation of fluorescent display tubes.

Incidentally, miniaturization of semiconductor devices has progressed, and the chip area has been reduced, thus contributing to realize further lower power dissipation. On the other hand, the break down voltage level of semiconductor devices is decreasing. In realizing driver devices for the fluorescent display tube by means of semiconductor devices, for example, 60 volt is required as the break down voltage level of the semiconductor devices. In the semiconductor devices of such a high break down voltage, the transistor size, the wiring space, and the like need to be increased, thereby preventing the reduction of the chip area.

Especially, in the driver device for the fluorescent display tube, a plurality of driver circuits for electrodes at the anode side of the fluorescent display tube are disposed. Since there are limitations in reducing the size of the driver transistors of a high break down voltage, the disposed length of a plurality of driver circuits has become long in the driver devices used for fluorescent display tubes, and thus a capability of disposing each driver circuit with a narrow pitch is strongly demanded.

Japanese Unexamined Patent Publication No. 6-45602 is an example of the related art.

Japanese Unexamined Patent Publication No. 2001-196546 is another example of the related art.

Incidentally, the driver circuit of the driver device used for fluorescent display tubes can be configured using driver transistors. When disposing such a driver circuit along the disposing direction of the electrodes at the anode side of the fluorescent display tube, it is conceivable that the source region of the driver transistors configuring the driver circuit is disposed so as to share the source region of the adjoining driver transistor (in the driver circuit). In this case, the length in the disposing direction can be reduced because the source region is shared.

On the other hand, in the semiconductor devices disclosed in the examples of the related art, techniques to reduce each driver transistor while maintaining a high break down voltage are disclosed. Accordingly, even if multiple disposition is carried out by using such driver transistors and by causing them to simply share the source region, the break down voltage level may not be increased.

In general, in case of sharing a source region, for the purpose of stabilizing the substrate potential it is necessary to provide a back gate electrode in the source region, the back gate electrode for giving a relevant substrate potential. For this reason, even if driver transistors of a high break down voltage are simply disposed, it may not be possible to supply or to take out electric charges sufficiently to/from the substrate via the back gate electrode. Accordingly, as the voltage increases, it will be impossible to function as a transistor and thus the so-called breakdown voltage will be reduced.

SUMMARY

An advantage of the invention is to provide semiconductor devices in which transistors of a high break down voltage are disposed with a narrow pitch, and to provide a method for manufacturing the same.

According to a first aspect of the invention, the semiconductor device includes:

a first transistor of a second electric conductivity type formed in a substrate (6, 10) including impurities of a first electric conductivity type; and a second transistor of the second electric conductivity type formed in the substrate, a source region of the second transistor being shared with a source region (Sc) of the first transistor; wherein in a lower layer of a gate insulating film (70a) of the first transistor, a first offset layer (50a) of the second electric conductivity type is formed adjacent to a channel region of the first transistor, in a lower layer of a gate insulating film (70b) of the second transistor, a second offset layer (50b) of the second electric conductivity type is formed adjacent to a channel region of the second transistor, and in the source region (Sc), a first diffusion layer (54) of the first electric conductivity type and a second diffusion layer (52) of the first electric conductivity type in the upper layer of the first diffusion layer (54) are formed, and wherein the second diffusion layer (52) is provided so as to come in contact with the first and second offset layers (50a, 50b) via the first diffusion layer (54), and the impurity concentration of the first diffusion layer (54) is higher than the impurity concentration of the substrate.

In the semiconductor device concerning the invention, further, the impurity concentration of the first diffusion layer (54) may be lower than the impurity concentration of the second diffusion layer (52).

According to the invention, the second diffusion layer (52) formed in the source region (Sc), with which the first and second transistors share, is provided so as to come in contact with the first and second offset layers (50a, 50b) via the first diffusion layer (54) that is similarly formed in the source region (Sc). Accordingly, due to the first and second offset layers (50a, 50b), an electric field can be prevented from concentrating in the lower layer of LOCOS oxide film (70a, 70b). Thereby, it is possible to employ the so-called common substrate structure and increase the break down voltage (the drain break down voltage) level. In other words, it is possible to provide semiconductor devices in which transistors of a high break down voltage are disposed with a narrow pitch.

The semiconductor device concerning the invention may further include:

a first stopper layer (60a) of the second electric conductivity type formed in between the gate insulating film (70a) of the first transistor and the first offset layer (50a); and a second stopper layer (58a) of the first electric conductivity type formed in the boundary between the first diffusion layer (54) and the first stopper layer (60a), wherein the impurity concentration of the first stopper layer (60a) may be higher than the impurity concentration of the first offset layer (50a), and the impurity concentration of the second stopper layer (58a) may be higher than the impurity concentration of the first diffusion layer (54).

In the semiconductor device concerning the invention, further, the impurity concentration of the second stopper layer (58a) may be lower than the impurity concentration of the second diffusion layer (52).

The semiconductor device concerning the invention may further include:

a third stopper layer (60b) of the second electric conductivity type formed in between the gate insulating film (70b) of the second transistor and the second offset layer (50b); and a fourth stopper layer (58b) of the first electric conductivity type formed in the boundary between the first diffusion layer (54) and the third stopper layer (60b), wherein the impurity concentration of the third stopper layer (60b) may be higher than the impurity concentration of the second offset layer (50b), and the impurity concentration of the fourth stopper layer (58b) may be higher than the impurity concentration of the first diffusion layer (54).

In the semiconductor device concerning the invention, further, the impurity concentration of the fourth stopper layer (58b) may be lower than the impurity concentration of the second diffusion layer (52).

According to the invention, it is possible to provide the first or third stopper layer (60a, 60b) to make a lower resistive layer than the first and second offset layers (50a, 50b) in the lower layer of the LOCOS oxide films (70a, 70b). Thereby, the electric current flowing in the source region (Sc) can be increased, and the capability of high break down voltage transistors that employ the so-called common substrate structure can be improved.

Then, in the boundary between the first diffusion layer (54) and the first or third stopper layer (60a, 60b), the second or fourth stopper layer (58a, 58b) of an electric conductivity type different from that of the first or third stopper layer (60a, 60b) is provided. Thereby, it is possible to suppress the expansion of the depletion layer produced by the junction of between the first diffusion layer (54) and the first or third stopper layer (60a, 60b), and as a result, the capability of injecting or taking out electric charges via the second diffusion layer (52) will not be reduced anymore, and thus the deterioration of the break down voltage level can be suppressed.

According to another aspect of the invention, a method for manufacturing a semiconductor device including first and second transistors that share a source region, the method includes the steps of:

forming the first and second offset layers (50a, 50b) of the second electric conductivity type in the substrate (6, 10) including impurities of the first electric conductivity type, the substrate to be a source region;

forming the first diffusion layer (54) of the first electric conductivity type in between the first and second offset layers (50a, 50b) by introducing impurities of the first electric conductivity type;

forming the gate oxide film (70a, 70b) of the first and second transistors;

forming the second diffusion layer (52) by introducing impurities of the first electric conductivity type so that the first diffusion layer (54) may come in contact with the first and second offset layers (50a, 50b) via the second diffusion layer (52) of the first electric conductivity type, wherein the impurity concentration of the second diffusion layer (52) is higher than the impurity concentration of the substrate (6, 10).

Moreover, in the method for manufacturing a semiconductor device concerning the invention, further, the impurity concentration of the first diffusion layer (54) may be lower than the impurity concentration of the second diffusion layer (52).

Moreover, the method for manufacturing a semiconductor device concerning the invention may further include the steps of:

forming the first stopper layer (60a) of the second electric conductivity type in between the gate insulating film (70a) of the first transistor and the first offset layer (50a); and forming the second stopper layer (58a) of the first electric conductivity type in the boundary between the first diffusion layer (54) and the first stopper layer (60a), wherein the impurity concentration of the first stopper layer (60a) may be higher than the impurity concentration of the first offset layer (50a), and the impurity concentration of the second stopper layer (58a) may be higher than the impurity concentration of the first diffusion layer (54).

Moreover, in the method for manufacturing a semiconductor device concerning the invention, further, the impurity concentration of the second stopper layer (58a) may be lower than the impurity concentration of the second diffusion layer (52).

Moreover, the method for manufacturing a semiconductor device concerning the invention may further includes the steps of:

forming the third stopper layer (60b) of the second electric conductivity type in between the gate insulating film (70b) of the second transistor and the second offset layer (50b); and forming the fourth stopper layer (58b) of the first electric conductivity type in the boundary between the first diffusion layer (54) and the third stopper layer (60b), wherein the impurity concentration of the third stopper layer (60b) may be higher than the impurity concentration of the second offset layer (50b), and the impurity concentration of the fourth stopper layer (58b) may be higher than the impurity concentration of the first diffusion layer (54).

Moreover, in the manufacturing method for a semiconductor device concerning the invention, further, the impurity concentration of the fourth stopper layer (58b) may be lower than the impurity concentration of the second diffusion layer (52).

BRIEF DESCRIPTION OF THE DRAWINGS

The invention will be described with reference to the accompanying drawings, wherein like numbers refer to like elements, and wherein:

FIG. 12A is a view schematically showing a sectional view in C-C' of FIG. 11;

FIG. 12B is a view schematically showing a sectional view in D-D' of FIG. 11;

DESCRIPTION OF THE EMBODIMENTS

Hereinafter, embodiments of the invention will be described in detail with reference to the accompanying drawings. In addition, the embodiments to be described hereinafter do not unduly restrict the contents of the invention described in claims. Moreover, all the configurations to be described hereinafter are not necessarily indispensable configuration requirements of the invention.

1. Semiconductor Device

Semiconductor devices in the embodiment will be applied to driver devices for driving a fluorescent display tube, for example. In this driver device, a plurality of driver circuits for driving the electrodes at the anode side of the fluorescent display tube are disposed.

Figure 1:
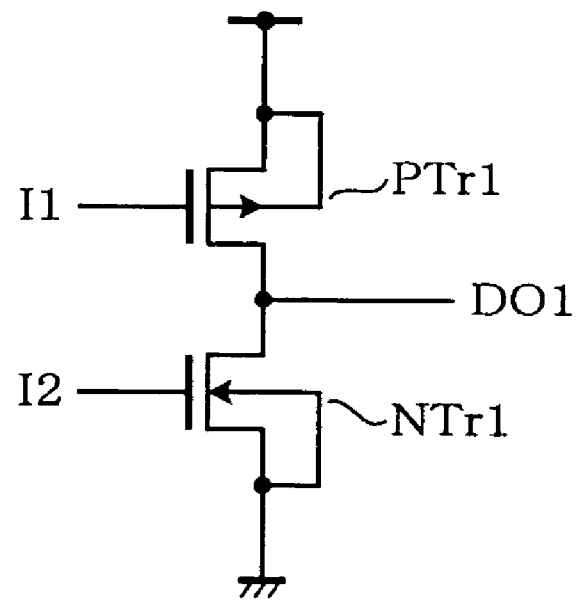
FIG. 1 is a circuit diagram of a configuration example of a driver circuit for a driver device to which a semiconductor device in the embodiment is applied.
Figure 1:
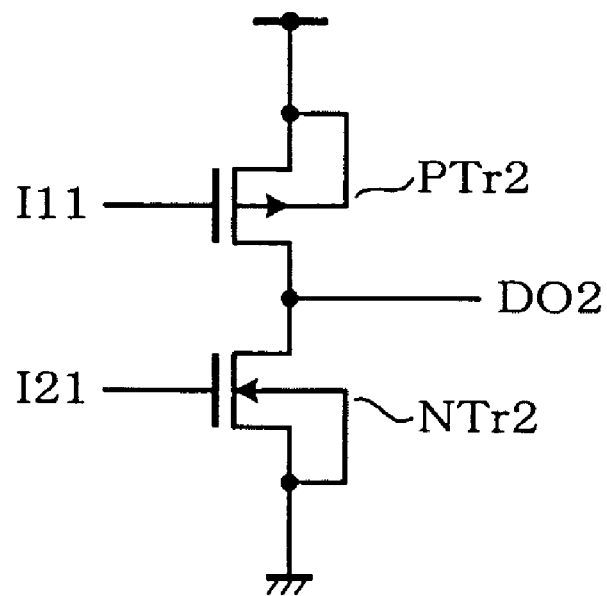

FIG. 1 is a circuit diagram of a configuration example of a driver circuit for a driver device to which a semiconductor device in the embodiment is applied.

The driver circuit includes a P-type (a first electric conductivity type) driver transistor and an N-type (a second electric conductivity type) driver transistor for driving one electrode. In FIG. 1, in between a high-potential side power supply line to which a high-potential side power supply voltage is supplied, and a low-potential side power supply line to which a low-potential side power supply voltage is supplied, a P-type driver transistor and an N-type driver transistor coupled in series are inserted.

The drain of a P-type driver transistor PTr1 is coupled with the drain of an N-type driver transistor NTr1. To a gate of the P-type driver transistor PTr1 an input signal I1 is supplied, and to the gate of the N-type driver transistor NTr1 an input signal I2 is supplied. Then, based on the input signals I1 and I2, the drain voltage of the P-type driver transistor PTr1 and the N-type driver transistor NTr1 is determined, and this drain voltage is supplied to one electrode of a fluorescent display tube as an output signal DO1.

In the same way, also in a driver circuit for driving another electrode, the drain of a P-type driver transistor PTr2 is coupled with the drain of an N-type driver transistor NTr2. To the gate of the P-type driver transistor PTr2 an input signal I11 is supplied, and to the gate of the N-type driver transistor NTr2 an input signal I21 is supplied. Then, based on the input signals I11 and I21, the drain voltage of the P-type driver transistor PTr2 and the N-type driver transistor NTr2 is determined, and this drain voltage is supplied to one electrode of the fluorescent display tube as an output signal DO2.

Incidentally, in arranging a plurality of such driver transistors along a predetermined direction, the so-called common substrate structure can be employed.

Figure 2A:
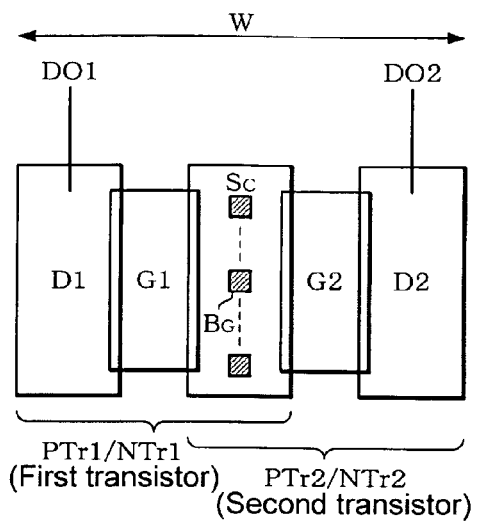
FIG. 2A and FIG. 2B are explanatory views of a common substrate structure.
Figure 2B:
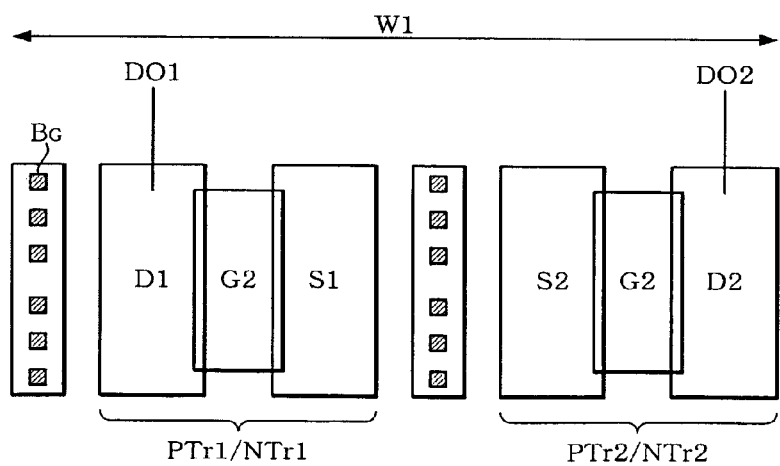

FIG. 2A and FIG. 2B show explanatory views of the common substrate structure. FIG. 2A schematically shows a plane view of a semiconductor device in the case where the common substrate structure is employed. FIG. 2B schematically shows a plane view of the semiconductor device in the case where the common substrate structure is not employed.

As shown in FIG. 2A, in the common substrate structure, when disposing two or more transistors of an identical electric conductivity type, the source region of the respective transistors is shared and at the same time a back gate electrode for stabilizing the substrate potential is provided in this source region. Namely, in FIG. 2A, the P-type driver transistor PTr1 (the first transistor) includes a drain region D1, a gate electrode G1, and a source region Sc, and the P-type driver transistor PTr2 (the second transistor) includes a drain region D2, a gate electrode G2, and the source region Sc. Then, in the source region Sc a back gate electrode BG is formed. In FIG. 2A, the same is true if the first transistor is replaced with the N-type driver transistor NTr1, and the second transistor is replaced with the N-type driver transistor NTr2.

On the other hand, in FIG. 2B, the source region of each transistor is provided separately and at the same time the back gate electrode is provided for each transistor. Accordingly, if let the length, in the case where the common substrate structure is employed and the first and second transistors are disposed in a predetermined direction, be W (FIG. 2A), and if let the length, in the case where the common substrate structure is not employed and the first and second transistors are disposed in a predetermined direction, be W1 (FIG. 2B), W can be made shorter than W1. For this reason, it is desirable that the common substrate structure should be employed in the case where a plurality of driver circuits are disposed in the direction in which the electrodes of a fluorescent display tube are disposed.

Hereinafter, the semiconductor devices in the embodiment having a structure of transistors suitable for such a driver circuit will be described.

Figure 3:
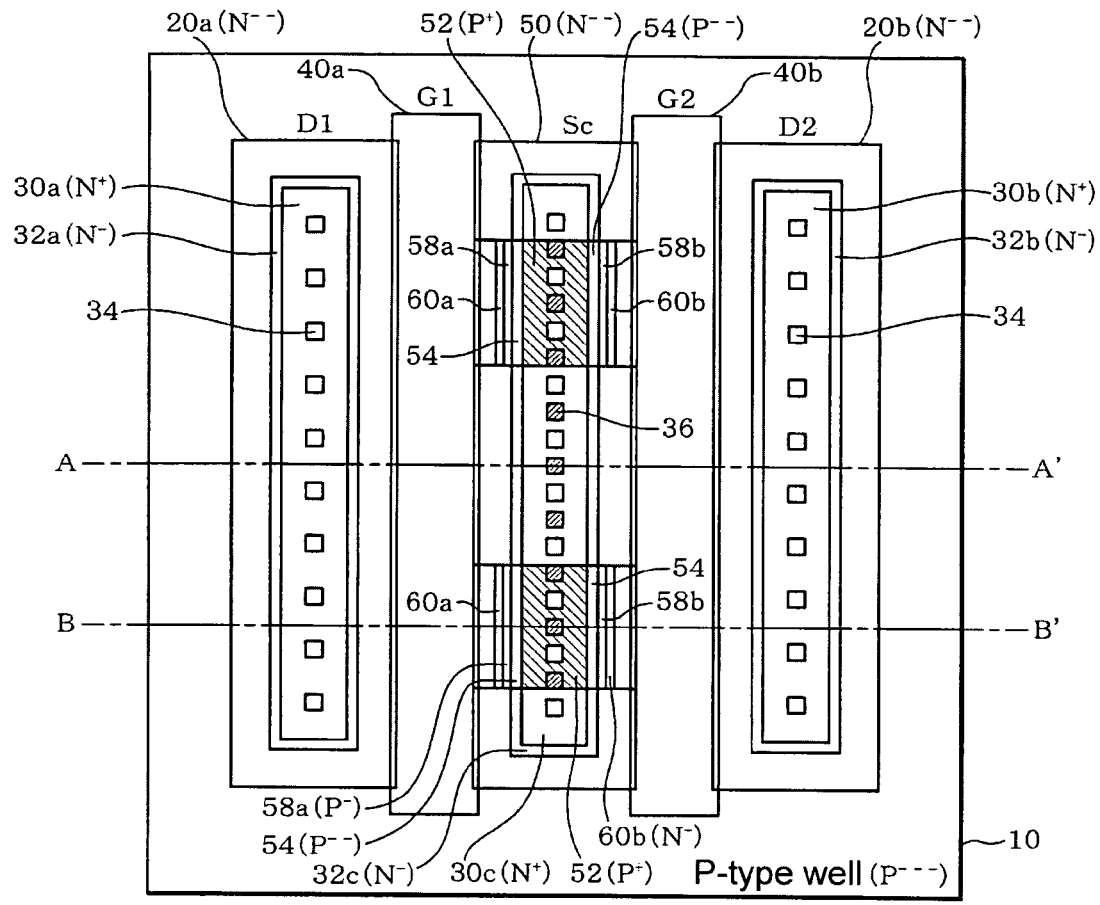
FIG. 3 is a plane view of the configuration example of the semiconductor device in the embodiment.

FIG. 3 shows a plane view of a configuration example of a semiconductor device in the embodiment.

In FIG. 3, a plane view of a semiconductor device including two N-type (a second electric conductivity type) metal oxide semiconductor (Metal Oxide Semiconductor: hereinafter to be abbreviated as MOS) transistors (first and second transistors) formed in a P-type (a first electric conductivity type) semiconductor substrate is schematically shown, and the illustration of wiring layers and insulating films are omitted suitably.

Figure 4A:
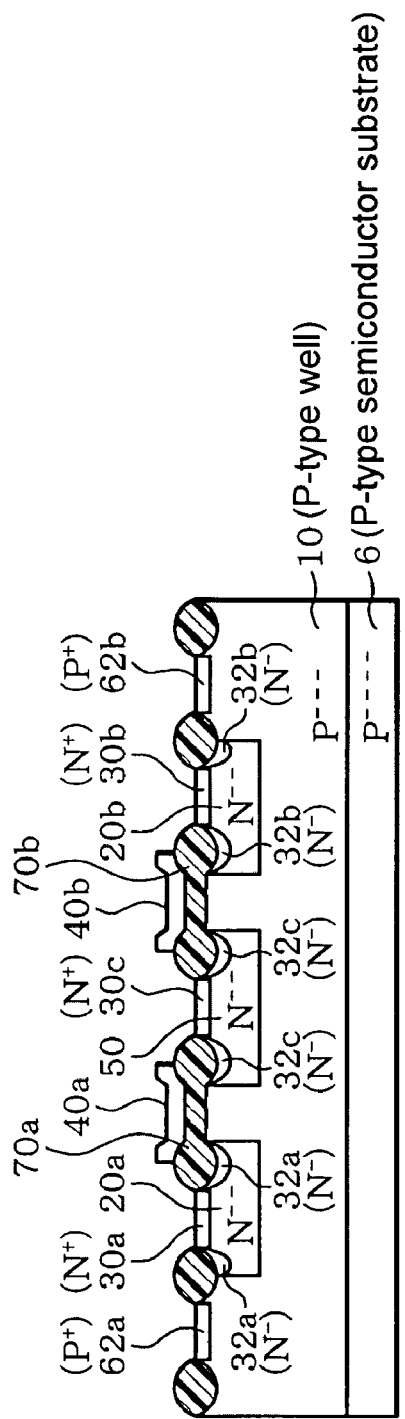
FIG. 4A is a view schematically showing a sectional view in A-A' of FIG. 3.
Figure 4B:
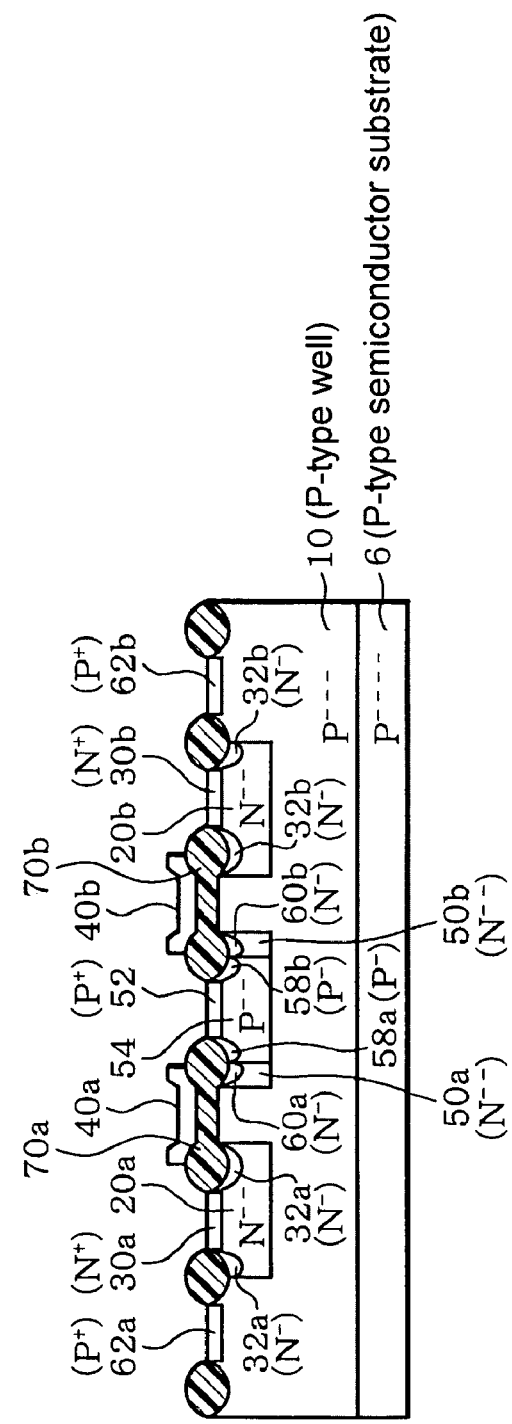
FIG. 4B is a view schematically showing a sectional view in B-B' of FIG. 3.

The sectional view in A-A' of FIG. 3 is schematically shown in FIG. 4A. The sectional view in B-B' of FIG. 3 is schematically shown in FIG. 4B. In addition, in FIG. 4A and FIG. 4B, high concentration impurity diffusion layers 62a and 62b (impurity concentration $P^+$) used for the back gate electrode, which are not shown in FIG. 3, are also shown.

The semiconductor device in the embodiment includes a P-type well 10 formed in a P-type semiconductor substrate 6. The impurity concentration ($P^{----}$) of the P-type semiconductor substrate 6 is lower than the impurity concentration ($P^{---}$) of the P-type well 10. The semiconductor substrate 6 or the P-type well 10 may be called a substrate including P-type impurities.

In the P-type well 10, two N-type transistors, first and second ones, are formed. Namely, the first and second transistors are formed in the substrate including P-type impurities.

The first transistor is realized with the drain region D1, the gate electrode G1, and the source region Sc. The second transistor is realized with the drain region D2, the gate electrode G2, and the source region Sc. Namely, the source region of the first and second transistors is shared.

The gate electrode G1 is formed of an electric conductive electrode material 40a. The gate electrode G1 is formed in the upper layer of a LOCOS (local oxidation of Silicon) oxide film (insulating film) 70a which functions as a gate insulating film, so that the region in between the drain region D1 and the source region Sc becomes a channel region.

The gate electrode G2 is formed of an electric conductive electrode material 40b. The gate electrode G2 is formed in the upper layer of a LOCOS oxide film 70b which functions as a gate insulating film, so that the region in between the drain region D2 and the source region Sc becomes a channel region.

The drain regions D1 and D2 are composed of N-type impurity diffusion layers (diffusion layers, in a broad sense) 20a and 20b. In the drain region D1, as shown in FIG. 4A and FIG. 4B, a high concentration impurity diffusion layer 30a of an N-type to be electrically coupled with the drain electrode is formed in the upper layer of the impurity diffusion layer 20a. The impurity concentration ($N^{--}$) of the impurity diffusion layer 20a is lower than the impurity concentration ($N^+$) of the high concentration impurity diffusion layer 30a. Furthermore, in the impurity diffusion layer 20a, an N-type impurity diffusion layer 32a is formed in the lower layer of the LOCOS oxide film 70a which also functions for element isolation. The impurity concentration ($N^-$) of the impurity diffusion layer 32a is higher than the impurity concentration ($N^{--}$) of the impurity diffusion layer 20a. A contact 34 is formed in this high concentration impurity diffusion layer 30a as shown in FIG. 3. Since the drain region D2 has the same configuration as that of the drain region D1, the description thereof will be omitted.

In the source region Sc, the region for electrically coupling with the source electrode (FIG. 4A) and the region to be electrically coupled with the back gate electrode (FIG. 4B) are provided. In the source region Sc, N-type impurity diffusion layers 50a and 50b and a P-type impurity diffusion layer 54 are formed in the P-type well 10. A potential is given to the source region Sc via the contact 34 or a hole 136.

Furthermore, in the source region Sc, a high concentration impurity diffusion layer 30c of an N-type to be electrically coupled with the source electrode and a high concentration impurity diffusion layer 52 (a second diffusion layer) of a P-type to be electrically coupled with the back gate electrode are formed. The high concentration impurity diffusion layer 30c is formed in the upper layer of the impurity diffusion layers 50, 50a, and 50b. The impurity concentration ($N^+$) of the high concentration impurity diffusion layer 30c is higher than the impurity concentration ($N^{--}$) of the impurity diffusion layers 50, 50a, and 50b. The high concentration impurity diffusion layer 52 is formed in the upper layer of the impurity diffusion layer 54. The impurity concentration ($P^+$) of the high concentration impurity diffusion layer 52 is higher than the impurity concentration ($P^{--}$) of the impurity diffusion layer 54.

More specifically, in the lower layer of the LOCOS oxide film 70a (a gate insulating film of the first transistor), the N-type impurity diffusion layer 50a (a first offset layer or a first offset diffusion layer) is formed adjacent to the channel region of the first transistor. In the lower layer of the LOCOS oxide film 70b (a gate insulating film of the second transistor), the N-type impurity diffusion layer 50b (the second offset layer or the second offset diffusion layer) is formed adjacent to the channel region of the second transistor. Then, the high concentration impurity diffusion layer 52 (the second diffusion layer) is provided via the impurity diffusion layer 54 (the first diffusion layer) as to come in contact with the impurity diffusion layers 50a and 50b (the first and second offset layers). Here, the impurity concentration ($P^{--}$) of the impurity diffusion layer 54 (the first diffusion layer) is higher than the impurity concentration ($P^{----}$ or $P^{---}$) of the semiconductor substrate 6 or the P-type well 10. In addition, it is desirable that the impurity concentration of the impurity diffusion layer 54 (the first diffusion layer) should be lower than the impurity concentration of the high concentration impurity diffusion layer 52 (the second diffusion layer).

In this way, let a configuration in which the impurity diffusion layers 50a and 50b are formed in the lower layer of the LOCOS oxide films 70a and 70b be a first configuration example.

Furthermore, as shown in FIG. 4B, it is desirable to have an N-type diffusion layer 60a (a first stopper layer or first stopper diffusion layer) formed in between the LOCOS oxide film 70a (the gate insulating film of the first transistor) and the impurity diffusion layer 50a (the first offset layer), and a P-type diffusion layer 58a (a second stopper layer or second stopper diffusion layer) formed in the boundary between the impurity diffusion layer 54 (the first diffusion layer) and the diffusion layer 60a (the first stopper layer). Here, the impurity concentration ($N^-$) of the diffusion layer 60a (the first stopper layer) is higher than the impurity concentration ($N^{--}$) of the impurity diffusion layer 50a (the first offset layer). Moreover, the impurity concentration (P⁻) of the diffusion layer 58a (the second stopper layer) is higher than the impurity concentration (P⁻⁻) of the impurity diffusion layer 54 (the first diffusion layer). Furthermore, it is desirable that the impurity concentration (P⁻) of the diffusion layer 58a (the second stopper layer) should be lower than the impurity concentration (P⁺) of the high concentration impurity diffusion layer 52 (the second diffusion layer).

Moreover, as shown in FIG. 4B, it is desirable to have an N-type diffusion layer 60b (a third stopper layer or third stopper diffusion layer) formed in between the LOCOS oxide film 70b (the gate insulating film of the second transistor) and the impurity diffusion layer 50b (the second offset layer), and a P-type diffusion layer 58b (a fourth stopper layer) formed in the boundary between the impurity diffusion layer 54 (the first diffusion layer) and the diffusion layer 60b (the third stopper layer). Here, the impurity concentration (N⁻) of the diffusion layer 60b (the third stopper layer) is higher than the impurity concentration (N⁻⁻) of the impurity diffusion layer 50b (the second offset layer). Moreover, the impurity concentration (P⁻) of the diffusion layer 58b (the fourth stopper layer or the fourth stopper diffusion layer) is higher than the impurity concentration (P⁻⁻) of the impurity diffusion layer 54 (the first diffusion layer). Furthermore, it is desirable that the impurity concentration (P⁻) of the diffusion layer 58b (the fourth stopper layer) should be lower than the impurity concentration (P⁺) of the high concentration impurity diffusion layer 52 (the second diffusion layer).

In this way, let a configuration in which the diffusion layers 60a and 60b as the first stopper layer and the diffusion layers 58a and 58b as the second stopper layer are formed be a second configuration example.

Figure 5:
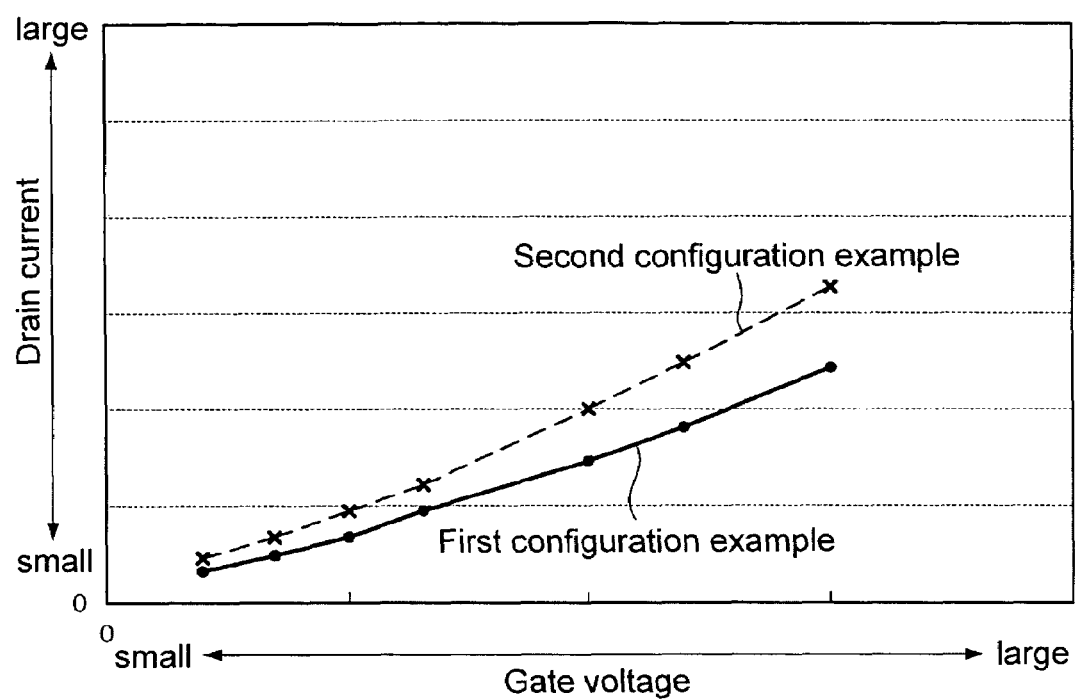
FIG. 5 is a view showing an example of the measurement results about the capability of an N-type MOS transistor in a first configuration example and an N-type MOS transistor in a second configuration example.

In FIG. 5, an example of the measurement results of the capability of the N-type MOS transistor in the first configuration example and the N-type MOS transistor in the second configuration example is shown.

In FIG. 5, the variations of drain current against the gate voltage amplitude at environmental temperature Ta of 85 degrees is shown as a capability of the MOS transistor. The larger the drain current against the same gate voltage, the higher the capability of the N-type MOS transistor. This is because the drain current flows more easily due to the fact that the resistive component of the diffusion layers 60a and 60b provided in the surface of the semiconductor substrate 6 is lower than that of the impurity diffusion layer 50b.

In this way, because more drain current can flow in the second configuration example as compared with the first configuration example, the capability of the MOS transistor can be enhanced. In other words, an L level output signal can be outputted at higher speed.

In addition, because a similar tendency is exhibited also at environmental temperature Ta of −40 degrees and 25 degrees, the illustration thereof is omitted.

Hereinafter, in contrast with the comparison example, the effect of the semiconductor device having the above-described structure according to the embodiment will be described.

Figure 6A:
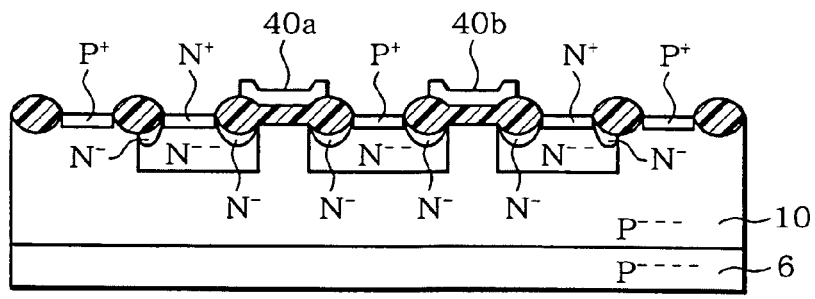
FIG. 6A and FIG. 6B are views schematically showing a sectional view of a semiconductor device including two N-type MOS transistors in a comparison example.
Figure 6B:
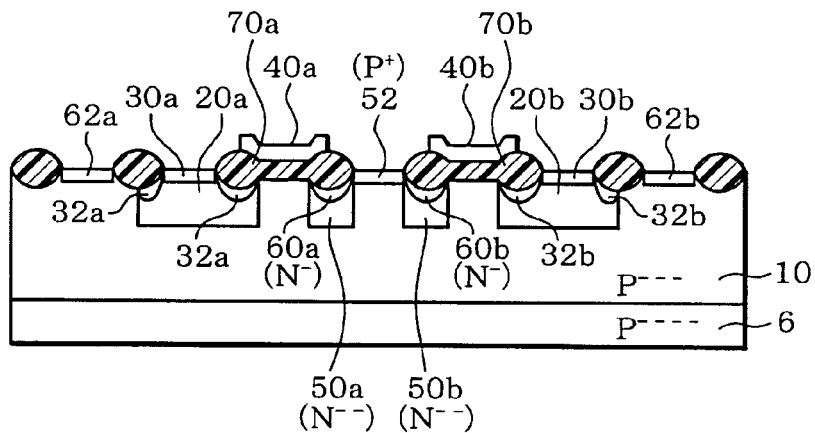

In FIG. 6A and FIG. 6B, as a comparison example of the embodiment, the sectional views of a semiconductor device including two N-type MOS transistors formed in a P-type semiconductor substrate are schematically shown.

FIG. 6A shows, just like FIG. 4A, the sectional view of a region for electrically coupling with a source electrode in the source region Sc. Since the structure of FIG. 6A and the structure of FIG. 4A are identical, the numerals and the description are omitted and only the impurity concentration for each impurity diffusion layer is shown.

FIG. 6B shows, just like FIG. 4B, the sectional view of a region to be electrically coupled with the back gate electrode in the source region Sc. The sectional view in the comparison example shown in FIG. 6B differs from the sectional view of the embodiment shown in FIG. 4B in the points that the lower layer of the high concentration impurity diffusion layer 52 used for the back gate electrode is the P-type well 10, and that the diffusion layers 58a and 58b (the first and second stopper layers) are not formed.

Figure 7:
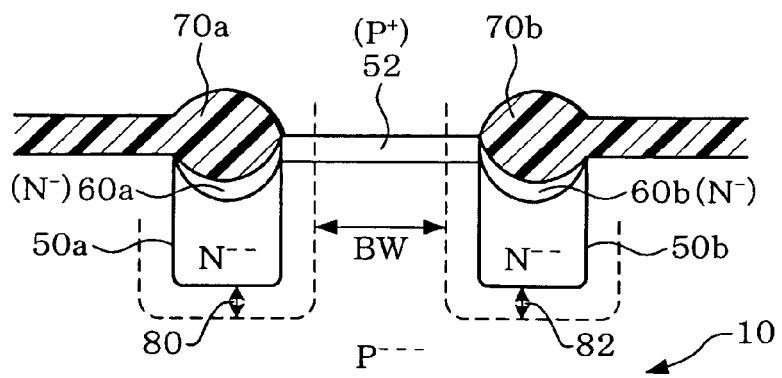
FIG. 7 is a sectional view of an enlarged vicinity of a high concentration impurity diffusion layer of FIG. 6B.

FIG. 7 shows a sectional view of an enlarged vicinity of the high concentration impurity diffusion layer 52 of FIG. 6B.

The high concentration impurity diffusion layer 52 is electrically coupled with the back gate electrode. Then, in order to stabilize the substrate potential, a capability of taking out positive electric charges sufficiently via the high concentration impurity diffusion layer 52 (a capability of supplying negative electric charges) is required.

In FIG. 7, the impurity diffusion layer 50 is provided in the lower layer of the LOCOS diffusion layer. By doing this way it is possible to prevent an inversion layer from being formed in the lower layer of the LOCOS oxide films 70a and 70b, thereby realizing an element isolation function and increasing the break down voltage.

Furthermore, the diffusion layers 60a and 60b are provided as a stopper layer in between the LOCOS oxide films 70a and 70b and the impurity diffusion layers 50a and 50b. In this case, the diffusion layers 60a and 60b prevent an inversion layer from being formed in the lower layer of the LOCOS oxide films 70a and 70b. Then, the impurity diffusion layers 50a and 50b prevent, as an offset layer, an electric field from concentrating in the boundary of the diffusion layers 60a and 60b formed in the lower layer of the LOCOS oxide films 70a and 70b. Accordingly, as a result, the break down voltage can be increased.

Here, a case where the voltage between the drain electrode and the source electrode has been increased will be considered. In this case, depletion layers 80 and 82 formed by the PN junction of between the P-type well 10 and the impurity diffusion layers 50a and 50b will expand. Then, a space BW between the depletion layers 80 and 82 becomes narrower, and it is thus impossible to take out the positive electric charges sufficiently via the high concentration impurity diffusion layer 52. This is because the depletion layers 80 and 82 will expand toward the P-type well 10 whose concentration is lower than that of the impurity diffusion layers 50a and 50b. For this reason, the electric charges will be accumulated in the P-type well 10, and thus the transistors will likely break down even at low voltage.

Figure 8:
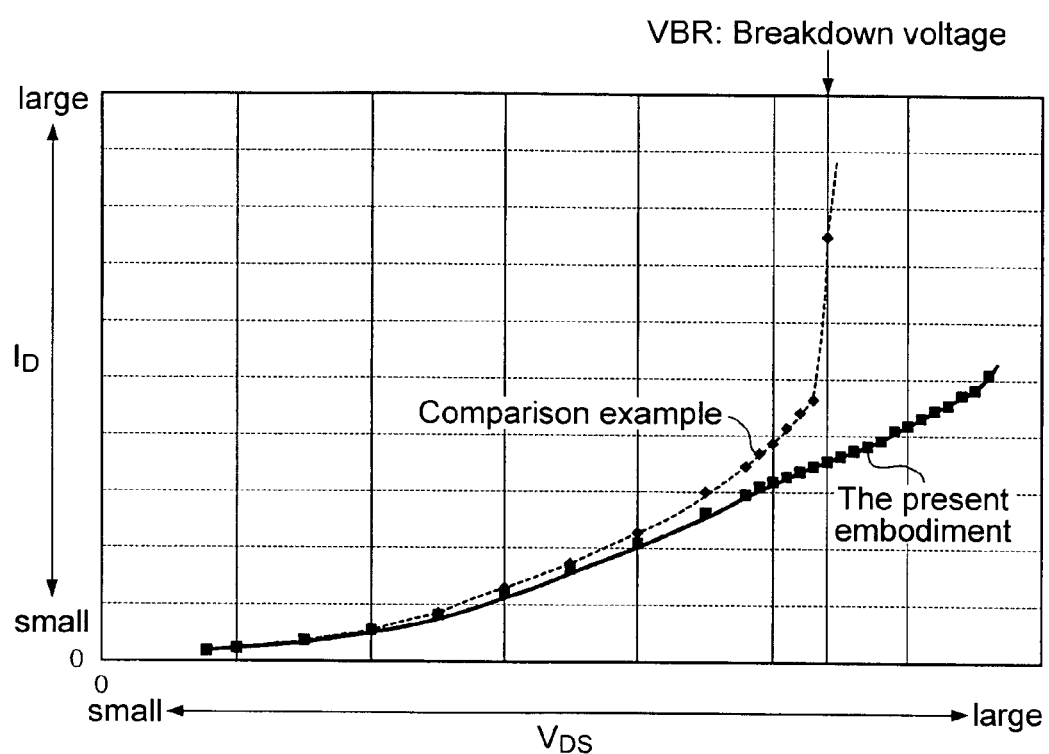
FIG. 8 is a view showing an example of the measurement results of the transistor characteristics in the embodiment and the comparison example.

In FIG. 8, an example of the measurement results of the transistor characteristics in the embodiment and the comparison example are shown.

FIG. 8 shows the measurement results of the drain current in varying the voltage between the drain electrode and the source electrode at environmental temperature Ta of 25 degrees. As shown, in the embodiment (the second configuration example), the transistor will not break down to the range of a predetermined high voltage, while in the comparison example, when having reached a breakdown voltage VBR, the drain current flows largely, thereby breaking down the transistors.

In this way, according to the embodiment, the break down voltage can be increased. For this reason, in the semiconductor device according to the embodiment, the impurity diffusion layer 54 is provided in the lower layer of the high concentration impurity diffusion layer 52 (FIG. 4B). Then, the impurity concentration of the impurity diffusion layer 54 is made higher than the impurity concentration (P⁻⁻⁻) of the P-type well 10. By doing this way, the expansion of the depletion layers 80 and 82 by the PN junction of between the impurity diffusion layers 50a as well as 50b and the P-type well 10 can be suppressed, and it is thus possible to prevent the space BW from being narrowed.

Figure 9:
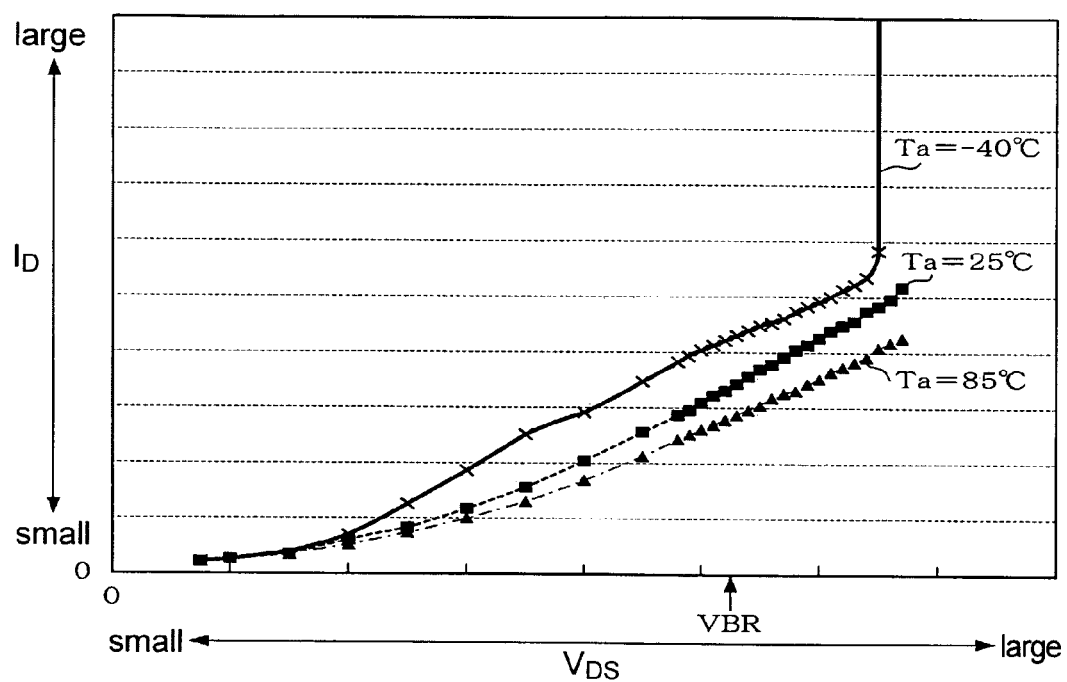
FIG. 9 is a view showing an example of the measurement results of the transistor characteristics in the first configuration example of the embodiment.

FIG. 9 shows an example of the measurement results of the transistor characteristics in the case where the impurity diffusion layer 54 is provided in the lower layer of the high concentration impurity diffusion layer 52 according to the embodiment. Namely, an example of the measurement results of the transistor characteristics in the first configuration example of the embodiment is shown.

FIG. 9 shows the drain current at environmental temperature Ta of −40 degrees, 25 degrees, and 85 degrees. As shown, the transistor does not break down even with the voltage beyond the breakdown voltage VBR of FIG. 8.

Furthermore, in the case where the diffusion layers 60a as well as 60b and the impurity diffusion layers 50a as well as 50b are formed in the lower layer of the LOCOS oxide films 70a and 70b, the impurity diffusion layer 54 may be provided as to come in contact with the diffusion layers 60a and 60b via the diffusion layers 58a and 58b, in the semiconductor device according to the embodiment. Thereby, the expansion of the depletion layers 80 and 82 formed by the PN junction of between the impurity diffusion layer 54 and the diffusion layers 60a and 60b can be also suppressed.

Figure 10:
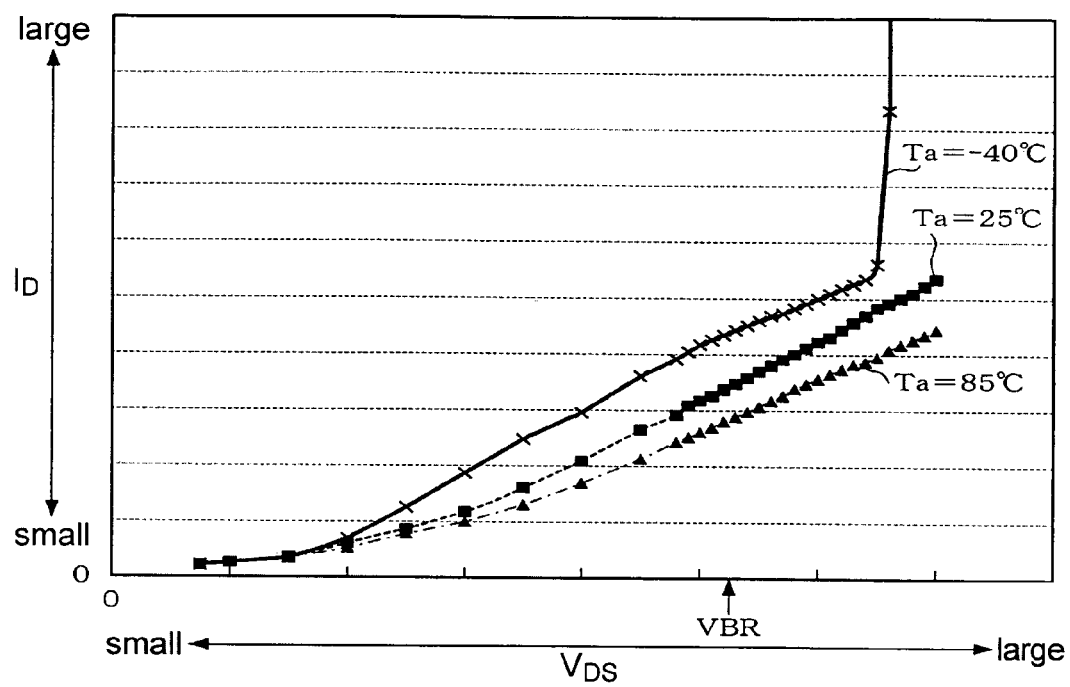
FIG. 10 is a view showing an example of the measurement results of the transistor characteristics in the second configuration example of the embodiment.

FIG. 10 shows an example of the measurement results of the transistor characteristics in the case where the impurity diffusion layer 54 is provided as to come in contact with the diffusion layers 60a and 60b via the diffusion layers 58a and 58b, in the embodiment. Namely, an example of the measurement results of the transistor characteristics in the second configuration example of the embodiment is shown.

FIG. 10 shows the drain current at environmental temperature Ta of −40 degrees, 25 degrees, and 85 degrees. Also in FIG. 10, just like in FIG. 9, it is shown that the transistor does not break down even with the voltage beyond the breakdown voltage VBR of FIG. 8.

In addition, in FIG. 3 through FIG. 10, a case where the transistor is formed in the P-type well 10 formed in the P-type semiconductor substrate 6 has been described, which is not limited to, and the same is true in the cases where this transistor is formed directly in the P-type semiconductor substrate 6. Also in this case, this P-type semiconductor substrate 6 may be called a substrate including P-type impurities, and it can be said that this transistor is formed in the substrate including P-type impurities.

Although in FIG. 3 through FIG. 10 the semiconductor device including the first and second transistors of an N-type (the second electric conductivity type) formed in the P-type (the first electric conductivity type) semiconductor substrate has been described, the same is true in the case of the semiconductor device that includes the first and second transistors of a P-type formed in the P-type semiconductor substrate.

Figure 11:
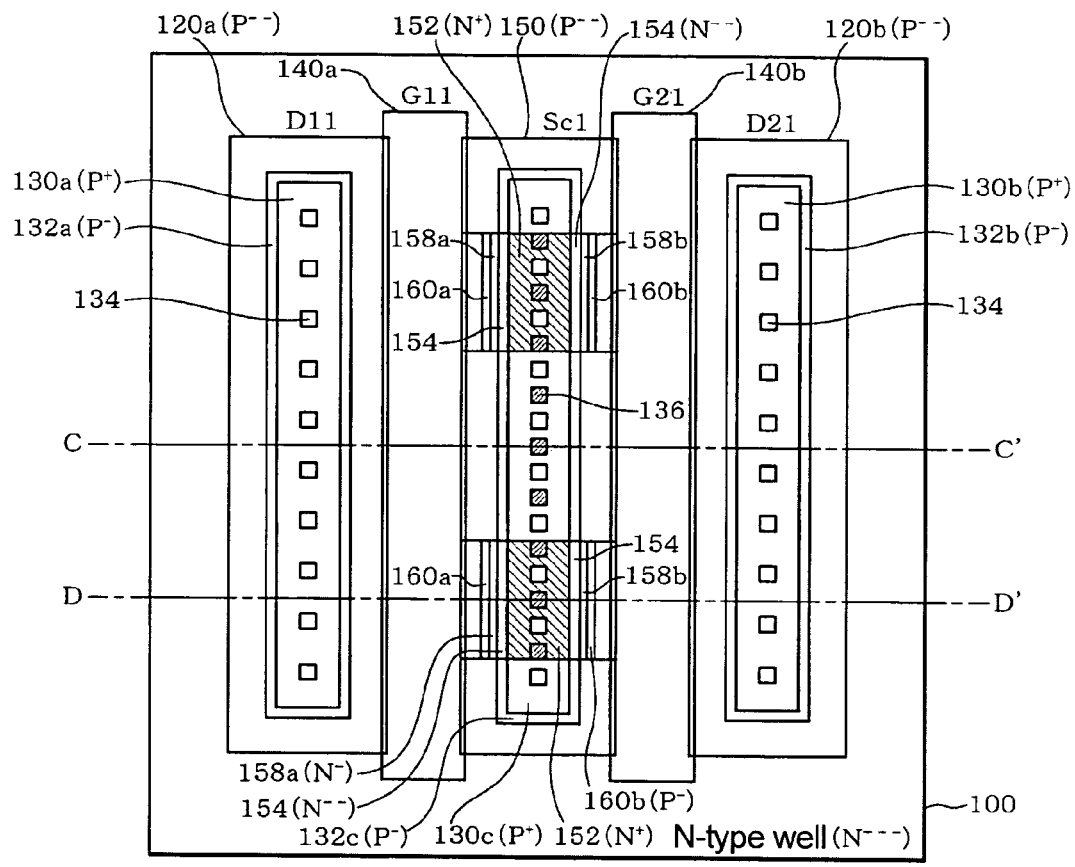
FIG. 11 is a plane view of another configuration example of the semiconductor device in the embodiment.

FIG. 11 shows a plane view of another configuration example of a semiconductor device in the embodiment.

In FIG. 11, just like FIG. 3, a plane view of a semiconductor device including two P-type (the first electric conductivity type) MOS transistors (the first and second transistors) formed in the P-type semiconductor substrate is shown schematically, and the illustration of wiring layers and insulating films are omitted suitably.

The sectional view in C-C' of FIG. 11 is schematically shown in FIG. 12A. The sectional view in D-D' of FIG. 11 is schematically shown in FIG. 12B. In addition, in FIG. 12A and FIG. 12B, high concentration impurity diffusion layers 162a and 162b (impurity concentration N$^+$) used for the back gate electrode, which are not shown in FIG. 11, are also shown.

This semiconductor device includes an N-type well 100 formed in a P-type semiconductor substrate 106. In the N-type well 100, two transistors, the first and second ones, of a P-type are formed. The first transistor is realized with a drain region D11, a gate electrode G11, and a source region Sc1. The second transistor is realized with a drain region D21, a gate electrode G21, and a source region Sc1. Namely, the source region of the first and second transistors is shared.

The gate electrode G11 is formed of an electric conductive electrode material 140a. The gate electrode G11 is formed in the upper layer of a LOCOS oxide film 170a which functions as a gate insulating film, so that the region in between the drain region D11 and the source region Sc1 may become a channel region.

The gate electrode G21 is formed of an electric conductive electrode material 140b. The gate electrode G21 is formed in the upper layer of a LOCOS oxide film 170b which functions as a gate insulating film, so that the region in between the drain region D21 and the source region Sc1 may become a channel region.

The drain regions D11 and D21 are composed of P-type impurity diffusion layers 120a and 120b. In the drain region D11, as shown in FIG. 12A and FIG. 12B, in the upper layer of the impurity diffusion layer 120a, a high concentration impurity diffusion layer 130a of a P-type to be electrically coupled with the drain electrode is formed. The impurity concentration (P$^{--}$) of the impurity diffusion layer 120a is lower than the impurity concentration (P$^+$) of the high concentration impurity diffusion layer 130a. Furthermore, in the impurity diffusion layer 120a, a P-type impurity diffusion layer 132a is formed in the lower layer of the LOCOS oxide film 170a which also functions for element isolation. The impurity concentration (P$^-$) of the impurity diffusion layer 132a is higher than the impurity concentration (P$^{--}$) of the impurity diffusion layer 120a. In the high concentration impurity diffusion layer 130a, a contact 134 is formed as shown in FIG. 11. Since the drain region D21 has the same configuration as that of the drain region D11, the description thereof will be omitted.

In the source region Sc1, a region for electrically coupling with the source electrode (FIG. 12A) and a region to be electrically coupled with the back gate electrode (FIG. 12B) are provided. In the source region Sc1, P-type impurity diffusion layers 150a and 150b and an N-type impurity diffusion layer 154 are formed in the N-type well 100. A potential is given to the source region Sc1 via the contact 34 or the hole 136.

Furthermore, in the source region Sc1, a P-type high concentration impurity diffusion layer 130c to be electrically coupled with the source electrode and an N-type high concentration impurity diffusion layer 152 (the second diffusion layer) to be electrically coupled with the back gate electrode are formed. The high concentration impurity diffusion layer 130c is formed in the upper layer of the impurity diffusion layers 150, 150a, and 150b. The impurity concentration (P$^+$) of the high concentration impurity diffusion layer 130c is higher than the impurity concentration (P$^{--}$) of the impurity diffusion layers 150, 150a, and 150b. The high concentration impurity diffusion layer 152 is formed in the upper layer of the impurity diffusion layer 154. The impurity concentration (N$^+$) of the high concentration impurity diffusion layer 152 is higher than the impurity concentration (N$^{--}$) of the impurity diffusion layer 154.

More specifically, the P-type impurity diffusion layer 150a (the first offset layer) is formed in the lower layer of the LOCOS oxide film 170a (the gate insulating film of the first transistor) adjacent to the channel region of the first transistor. Moreover, the P-type impurity diffusion layer 150b (the second offset layer) is formed in the lower layer of the LOCOS oxide film 170b (the gate insulating film of the second transistor) adjacent to the channel region of the second transistor. Then, the high concentration impurity diffusion layer 152 (the second diffusion layer) is provided via the impurity diffusion layer 154 (the first diffusion layer) as to come in contact with the impurity diffusion layers 150a and 150b (the first and second offset layers). Here, the impurity concentration ($N^{--}$) of the impurity diffusion layer 154 (the first diffusion layer) is higher than the impurity concentration ($N^{---}$) of the N-type well 100 (the impurity region). In addition, it is desirable that the impurity concentration of the impurity diffusion layer 154 (the first diffusion layer) should be lower than the impurity concentration of the high concentration impurity diffusion layer 152 (the second diffusion layer).

In this way, let a configuration in which the impurity diffusion layers 150a and 150b are formed in the lower layer of the LOCOS oxide films 170a and 170b be a third configuration example.

Furthermore, as shown in FIG. 12B, it is desirable to further include a P-type diffusion layer 160a (a first stopper layer) formed in between the LOCOS oxide film 170a (the gate insulating film of the first transistor) and the impurity diffusion layer 150a (the first offset layer), and an N-type diffusion layer 158a (a second stopper layer) formed in the boundary between the impurity diffusion layer 154 (the first diffusion layer) and the diffusion layer 160a (the first stopper layer). Here, the impurity concentration ($P^-$) of the diffusion layer 160a (the first stopper layer) is higher than the impurity concentration ($P^{--}$) of the impurity diffusion layer 150a (the first offset layer). Moreover, the impurity concentration ($N^-$) of the diffusion layer 158a (the second stopper layer) is higher than the impurity concentration ($N^{--}$) of the impurity diffusion layer 154 (the first diffusion layer). Furthermore, it is desirable that the impurity concentration ($N^-$) of the diffusion layer 158a (the second stopper layer) should be lower than the impurity concentration ($N^+$) of the high concentration impurity diffusion layer 152 (the second diffusion layer).

Moreover, as shown in FIG. 12B, it is desirable to include a P-type diffusion layer 160b (a third stopper layer) formed in between the LOCOS oxide film 170b (the gate insulating film of the second transistor) and the impurity diffusion layer 150b (the second offset layer), and an N-type diffusion layer 158b (a fourth stopper layer) formed in the boundary between the impurity diffusion layer 154 (the first diffusion layer) and the diffusion layer 160b (the third stopper layer). Here, the impurity concentration ($P^-$) of the diffusion layer 160b (the third stopper layer) is higher than the impurity concentration ($P^{--}$) of the impurity diffusion layer 150b (the second offset layer). Moreover, the impurity concentration ($N^-$) of the diffusion layer 158b (the fourth stopper layer) is higher than the impurity concentration ($N^{--}$) of the impurity diffusion layer 154 (the first diffusion layer). Furthermore, it is desirable that the impurity concentration ($N^-$) of the diffusion layer 158b (the fourth stopper layer) should be lower than the impurity concentration ($N^+$) of the high concentration impurity diffusion layer 152 (the second diffusion layer).

In this way, let a configuration in which the diffusion layers 160a and 160b as the first stopper layer and the diffusion layers 158a and 158b as the second stopper layer are formed be a fourth configuration example.

Figure 13:
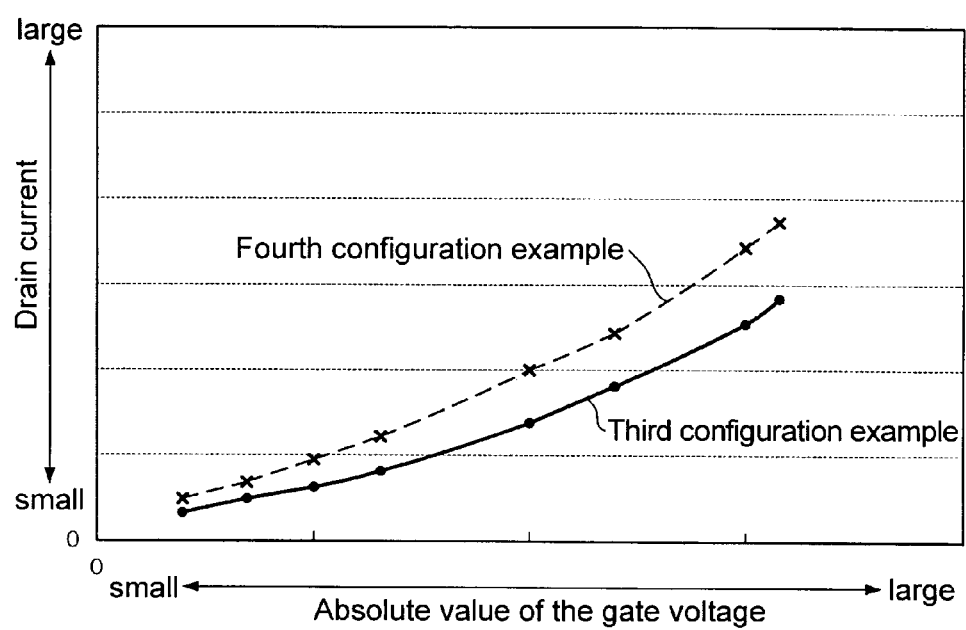
FIG. 13 is a view showing an example of the measurement results about the capability of a P-type MOS transistor in a third configuration example and a P-type MOS transistor in a fourth configuration example.

In FIG. 13, an example of the measurement results of the capability of the P-type MOS transistor in the third configuration example and the P-type MOS transistor in the fourth configuration example is shown.

In FIG. 13, the variations of drain current against the absolute value of the gate voltage at environmental temperature Ta of 85 degrees is shown as a capability of the MOS transistor. The larger the drain current against the absolute value of the same gate voltage, the higher the capability of the N-type MOS transistor. This is because the drain current flows more easily due to the fact that the resistive component of the diffusion layers 160a and 160b provided in the surface of the semiconductor substrate 106 is lower than that of the impurity diffusion layer 150b.

In this way, because more drain current can flow in the fourth configuration example as compared with the third configuration example, the capability of the MOS transistor can be enhanced. In other words, an H level output signal can be outputted at higher speed.

In addition, because a similar tendency is exhibited also at environmental temperature Ta of −40 degrees and 25 degrees, the illustration thereof will be omitted.

Hereinafter, just like the N-type MOS transistor, in contrast with the comparison example, the effect of the semiconductor device having the structure of FIG. 11, FIG. 12A, and FIG. 12B will be described.

Figure 14A:
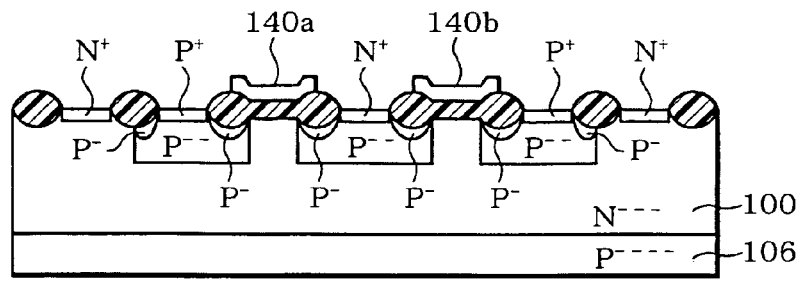
FIG. 14A and FIG. 14B are views schematically showing sectional views of a semiconductor device including two P-type MOS transistors in a comparison example.
Figure 14B:
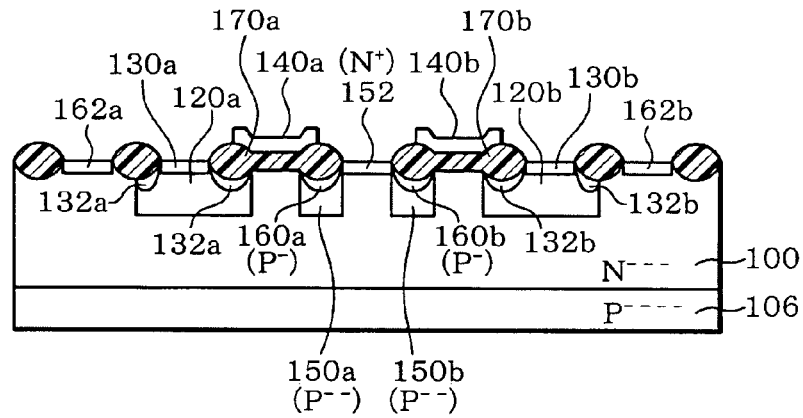

FIG. 14A and FIG. 14B schematically show, as a comparison example, the sectional views of a semiconductor device including two P-type MOS transistors formed in a P-type semiconductor substrate.

FIG. 14A, just like FIG. 12A, shows the sectional view of a region for electrically coupling with a source electrode in the source region Sc. Since the structure of FIG. 14A and the structure of FIG. 12A are identical, the numerals and the description are omitted and only the impurity concentration for each impurity diffusion layer is shown.

FIG. 14B, just like FIG. 12B, shows the sectional view of a region to be electrically coupled with the back gate electrode in the source region Sc. The sectional view in the comparison example shown in FIG. 14B differs from the sectional view of the embodiment shown in FIG. 12B in the points that the lower layer of the high concentration impurity diffusion layer 152 used for the back gate electrode is the N-type well 100, and that the diffusion layers 158a and 158b (the first and second stopper layers) are not formed.

Figure 15:
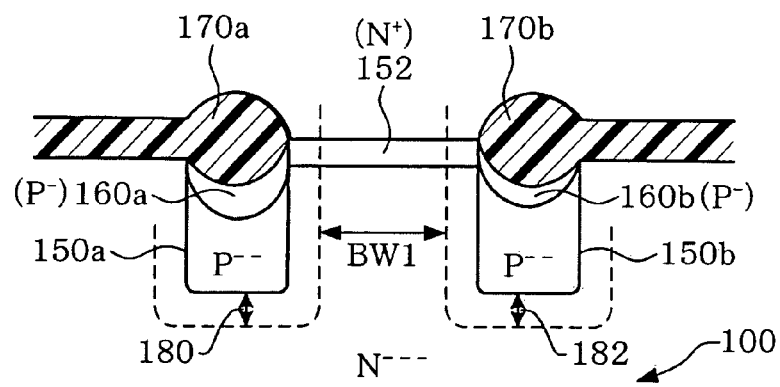
FIG. 15 is a sectional view of an enlarged vicinity of a high concentration impurity diffusion layer of FIG. 12B.

FIG. 15 shows a sectional view of an enlarged vicinity of the high concentration impurity diffusion layer 152 of FIG. 12B.

The high concentration impurity diffusion layer 152 is electrically coupled with the back gate electrode. Then, in order to stabilize the substrate potential, a capability of taking out negative electric charges (a capability of supplying positive electric charges) sufficiently via the high concentration impurity diffusion layer 152 is required.

In FIG. 15, the impurity diffusion layers 150a and 150b are provided in the lower layer of the LOCOS diffusion layer. By doing this way it is possible to prevent an inversion layer from being formed in the lower layer of the LOCOS oxide films 170a and 170b, thereby realizing an element isolation function and increasing the break down voltage.

Furthermore, the diffusion layers 160a and 160b are provided, as the stopper layer, in between the LOCOS oxide films 170a and 170b and the impurity diffusion layers 150. In this case, the diffusion layers 160a and 160b prevent an inversion layer from being formed in the lower layer of the LOCOS oxide films 170a and 170b. Then, the impurity diffusion layers 150a and 150b, as an offset layer, prevent an electric field from concentrating in the boundary of the diffusion layers 160a and 160b that are formed in the lower layer of the LOCOS oxide films 170a and 170b. Accordingly, as a result, the break down voltage can be increased.

Here, a case where the voltage between the drain electrode and the source electrode is increased will be considered. In this case, depletion layers 180 and 182 formed by a PN junction of between the N-type well 100 and the impurity diffusion layers 150a and 150b will expand. Then, a space BW1 between the depletion layers 180 and 182 becomes narrower, and it is thus impossible to take out negative electric charges sufficiently via the high concentration impurity diffusion layer 152. This is because the depletion layers 180 and 182 will expand toward the N-type well 100 whose concentration is lower than that of the impurity diffusion layers 150a and 150b. For this reason, the electric charges will be accumulated in the N-type well 100, and thus transistors will likely break down even at low voltage.

As described above, according to the embodiment (the third or fourth configuration example) described above, the semiconductor device in which the transistors of a high break down voltage are disposed with a narrow pitch can be provided.

In addition, although in the above-described embodiments the case where P-type or N-type MOS transistors are formed in the P-type semiconductor substrate 6 has been described, the same is true in the case where P-type or N-type MOS transistors are formed in an N-type semiconductor substrate.

2. Method for Manufacturing a Semiconductor Device

Next, the method for manufacturing a semiconductor device according to the embodiment will be described with reference to FIG. 16 through FIG. 28. Although hereinafter, the case where two N-type MOS transistors and two P-type MOS transistors are formed in a P-type semiconductor substrate will be described, the same is true in the case where two N-type MOS transistors and two P-type MOS transistors are formed in an N-type semiconductor substrate.

As shown in FIG. 3 and FIG. 4B, when a semiconductor device including the first and second transistors sharing a source region is manufactured, at first, the N-type impurity diffusion layers 50a and 50b (the first and second offset layers) are formed in a P-type impurity region to be a source region. Next, the P-type impurity diffusion layer 54 (the first diffusion layer) is formed in between the P-type impurity diffusion layers 50 (the first and second offset layers) by introducing P-type impurities. Then, the LOCOS oxide films 70a and 70b (the gate oxide films) are formed in the region to be the gate region of the first and second transistors. Then, the high concentration impurity diffusion layer 52 is formed by introducing P-type impurities so that the impurity diffusion layer 54 (the first diffusion layer) may come in contact with the impurity diffusion layers 50a and 50b (the first and second offset layers) via the P-type high concentration impurity diffusion layer 52 (the second diffusion layer).

Furthermore, it is desirable to include the steps of forming the N-type diffusion layer 60a (the first stopper layer) in between the LOCOS oxide film 70a (the gate insulating film of the first transistor) and the impurity diffusion layer 50a (the first offset layer); and forming the P-type diffusion layer 58a (the second stopper layer) in the boundary between the impurity diffusion layer 54 (the first diffusion layer) and the diffusion layer 60a (the first stopper layer).

Alternatively, it is desirable to further include the steps of forming the N-type diffusion layer 60b (the third stopper layer) in between the LOCOS oxide film 70b (the gate insulating film of the second transistor) and the impurity diffusion layer 50b (the second offset layer); and forming the P-type diffusion layer 58b (the fourth stopper layer) in the boundary between the impurity diffusion layer 54 (the first diffusion layer) and the diffusion layer 60b (the third stopper layer).

Hereinafter, an example of the manufacturing method of the embodiment will be described more in detail.

Figure 16:
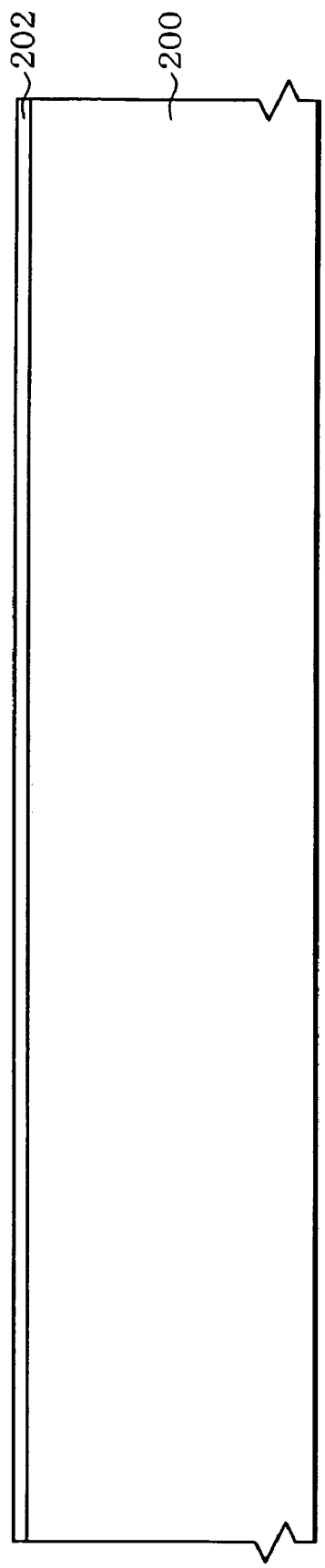
FIG. 16 is an explanatory view of a step of a method for manufacturing a semiconductor device in the embodiment.
Figure 17:
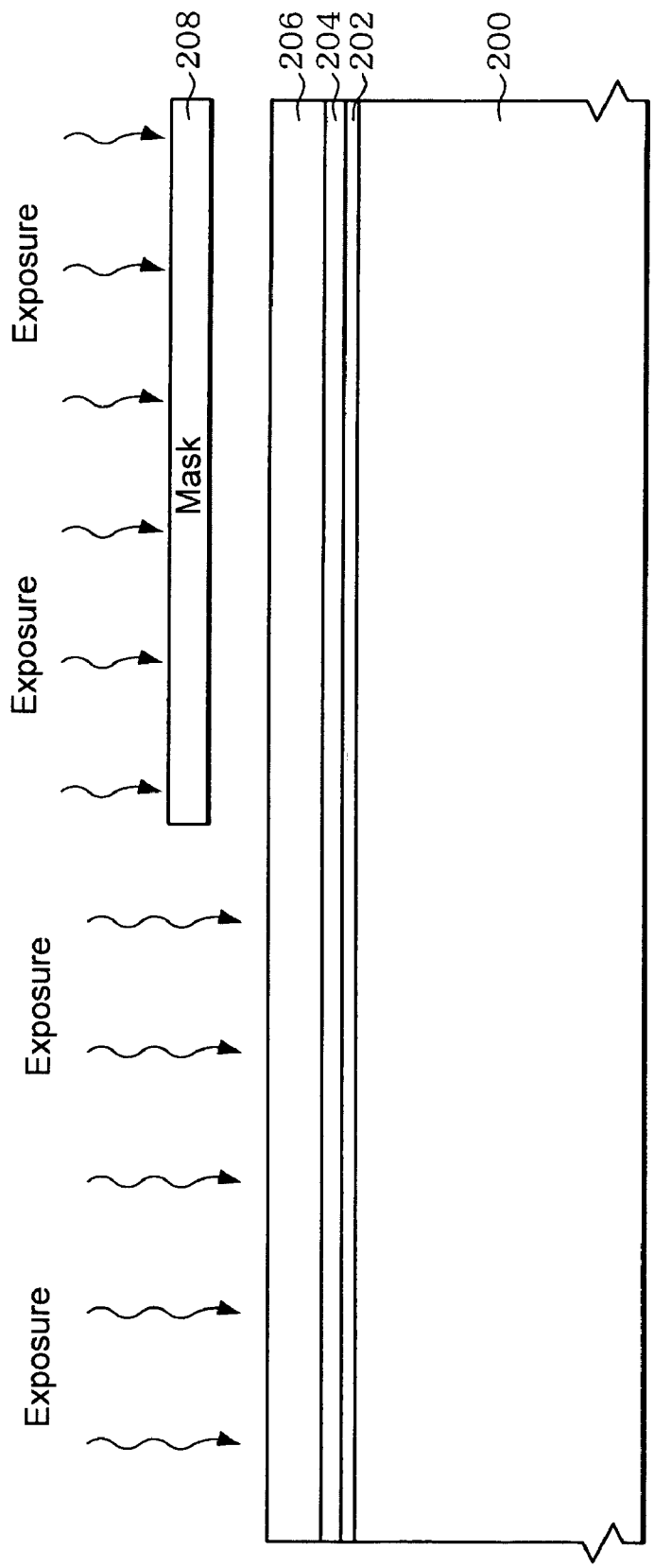
FIG. 17 is an explanatory view of a step of the method for manufacturing a semiconductor device in the embodiment.
Figure 18:
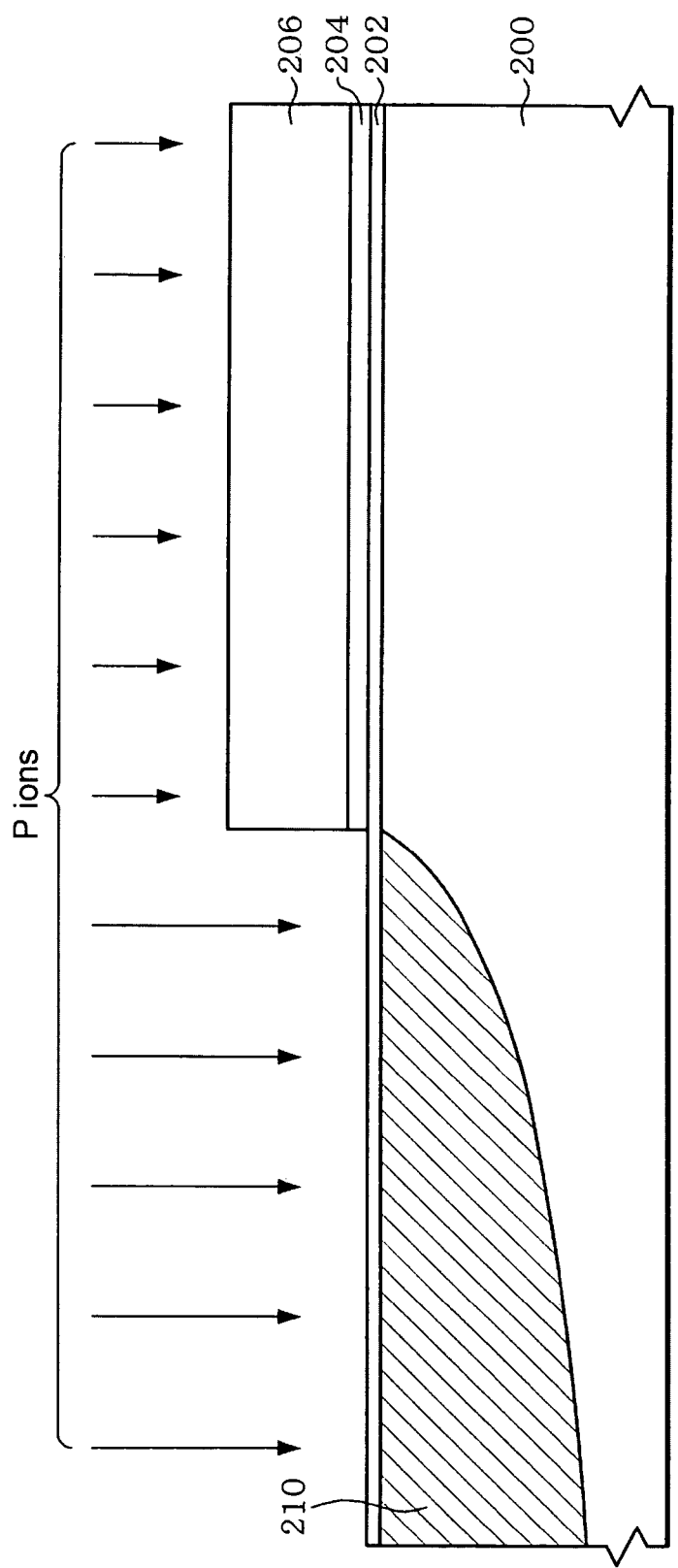
FIG. 18 is an explanatory view of a step of the method for manufacturing a semiconductor device in the embodiment.

First, a silicon oxide film 202 is formed in the surface of a substrate 200 by carrying out thermal oxidization to a P-type semiconductor (silicon) substrate 200 (refer to FIG. 16).

Next, in the upper layer of the silicon oxide film 202, for example, a silicon nitride layer is formed as a surface treatment film (an oxidation resistant layer) 204, and thereafter a resist layer 206 is formed in the upper layer of this surface treatment film 204. Then, exposure is carried out from above a mask 208 (refer to FIG. 17).

Then, the resist and the surface treatment film are removed by resist etching, and a patterning is carried out so that the position corresponding to a region for forming the N-type well may be opened. Then, with the resist layer 206 and the surface treatment film 204 being as a mask, for example, phosphorus ions are injected from the surface of the semiconductor substrate 200 to form an N-type well 210 which is an N-type impurity layer (refer to FIG. 18).

Figure 19:
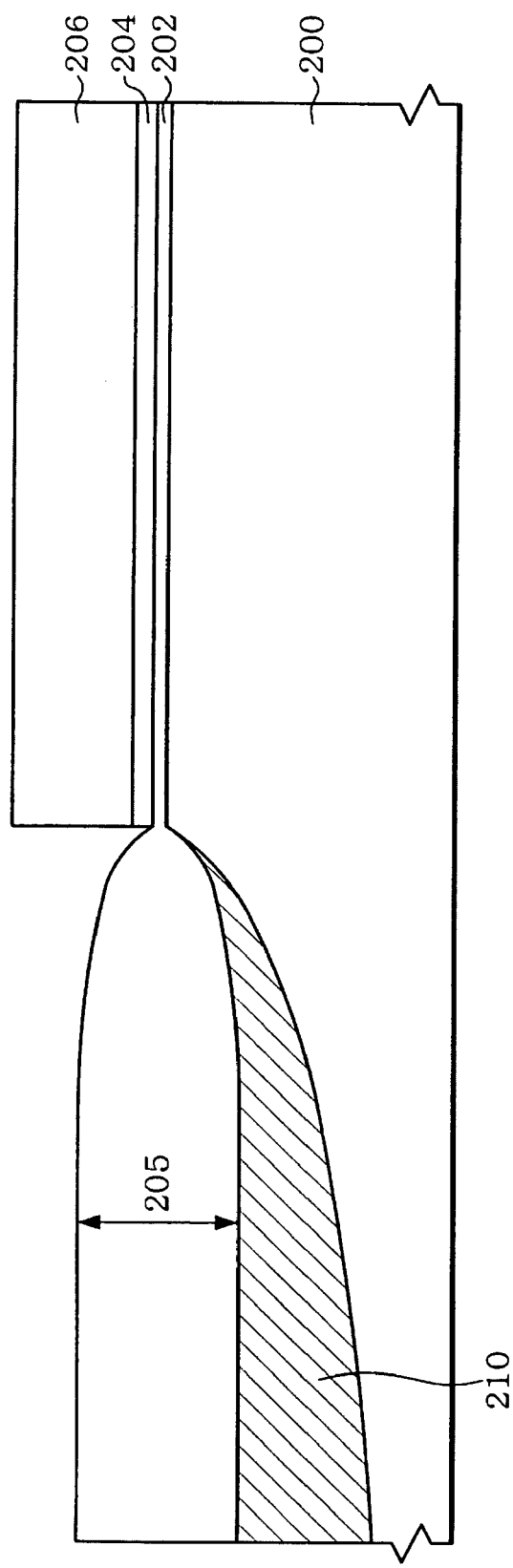
FIG. 19 is an explanatory view of a step of the method for manufacturing a semiconductor device in the embodiment.

Subsequently, a process for thickening the thickness of the silicon oxide film in the upper layer of the N-type well 210 is carried out by carrying out a thermal oxidation processing (refer to 205 of FIG. 19).

Figure 20:
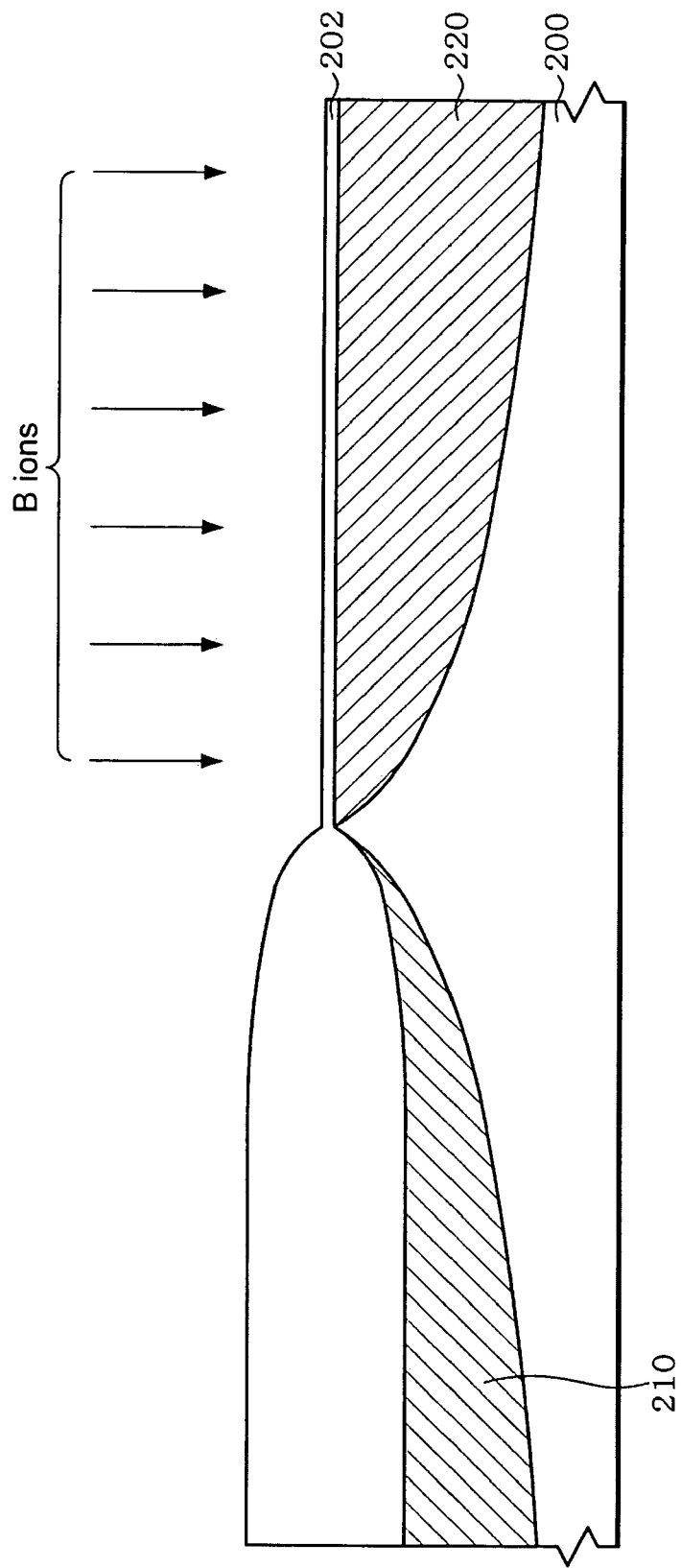
FIG. 20 is an explanatory view of a step of the method for manufacturing a semiconductor device in the embodiment.

Next, the resist layer 206 and the surface treatment film 204 are removed, and for example, boron ions are injected into a region for forming a P-type well from the surface of the semiconductor substrate 200, thereby forming a P-type well 220 which is a P-type impurity layer (refer to FIG. 20).

Figure 21:
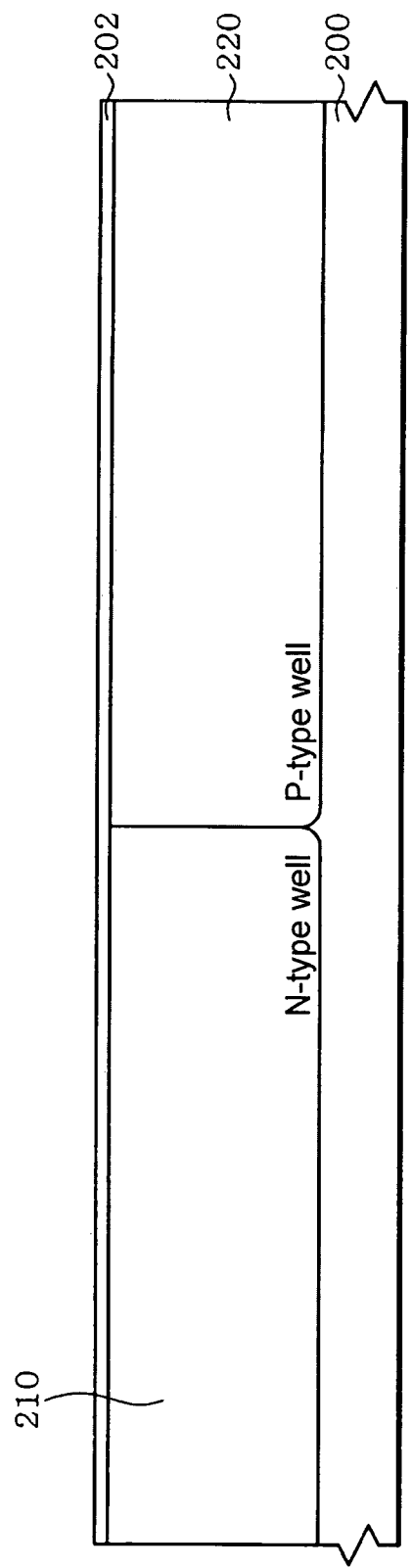
FIG. 21 is an explanatory view of a step of the method for manufacturing a semiconductor device in the embodiment.

Then, after planarizing the surface of the semiconductor substrate 200 with a sulfuric acid removal treatment, a thermal treatment is carried out to deepen the depth of the N-type well 210 and the P-type well 220 (refer to FIG. 21).

Figure 22:
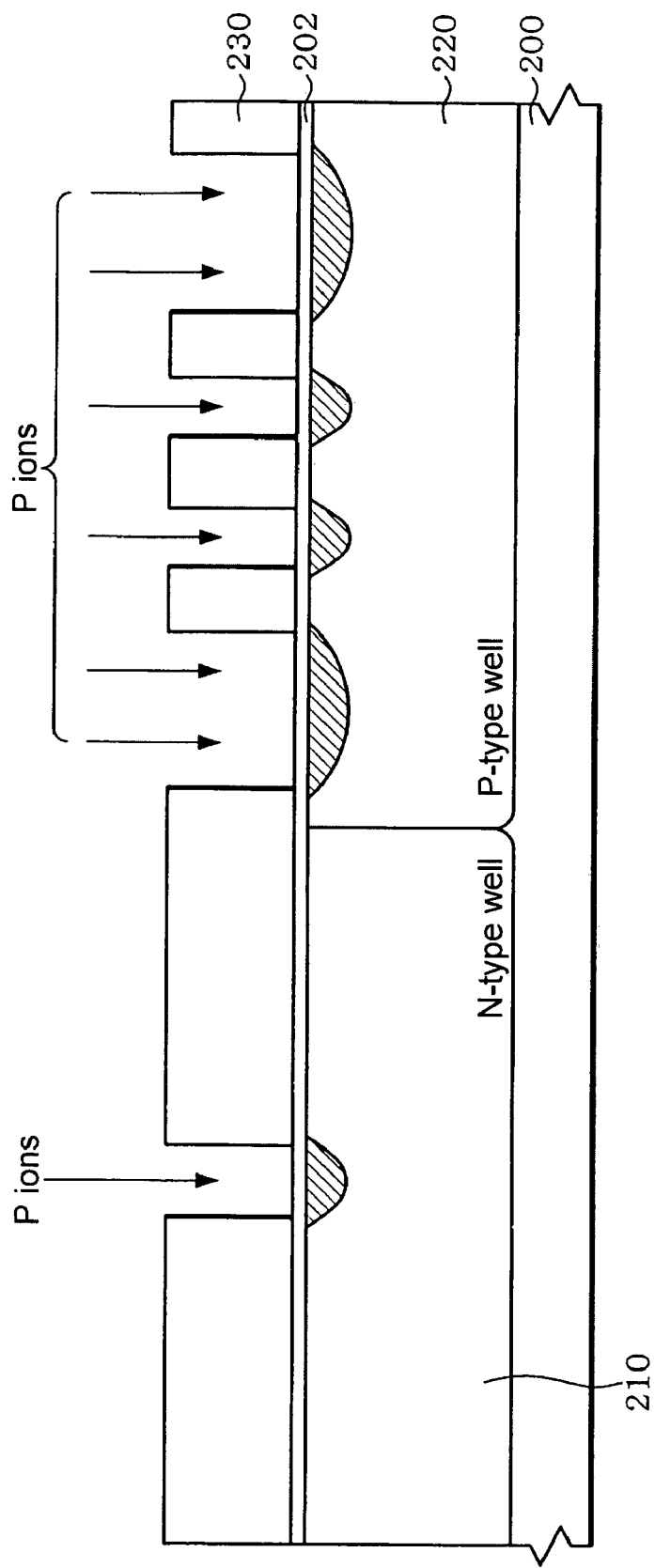
FIG. 22 is an explanatory view of a step of the method for manufacturing a semiconductor device in the embodiment.

Then, a resist layer 230 is formed in the upper layer of the silicon oxide film 202, and after patterning a region for forming an N-type impurity diffusion layer, for example, phosphorus ions are injected with this resist layer 230 being as the mask (refer to FIG. 22).

Figure 23:
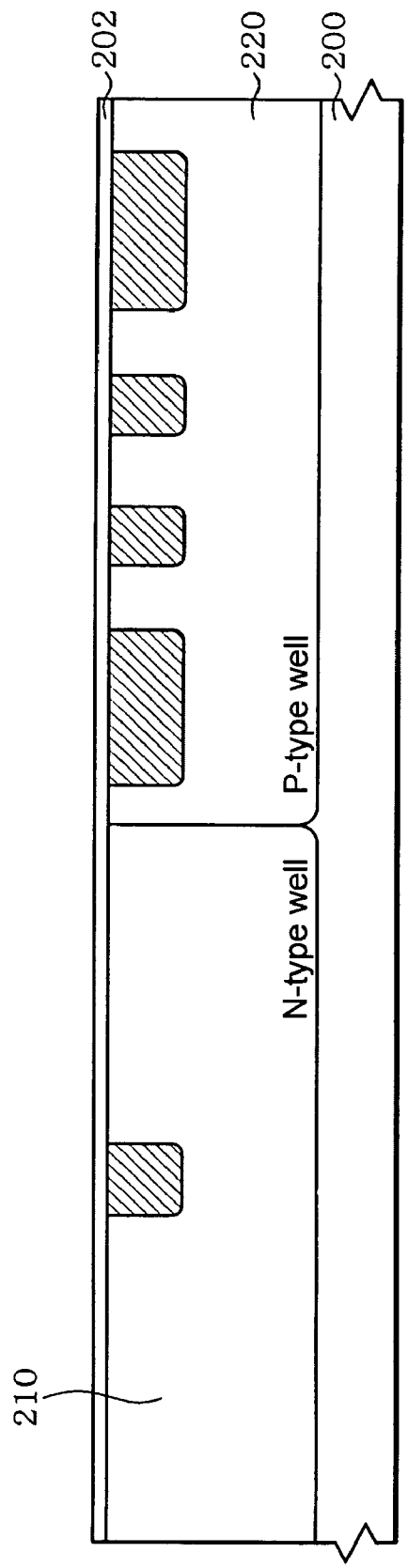
FIG. 23 is an explanatory view of a step of the method for manufacturing a semiconductor device in the embodiment.
Figure 24:
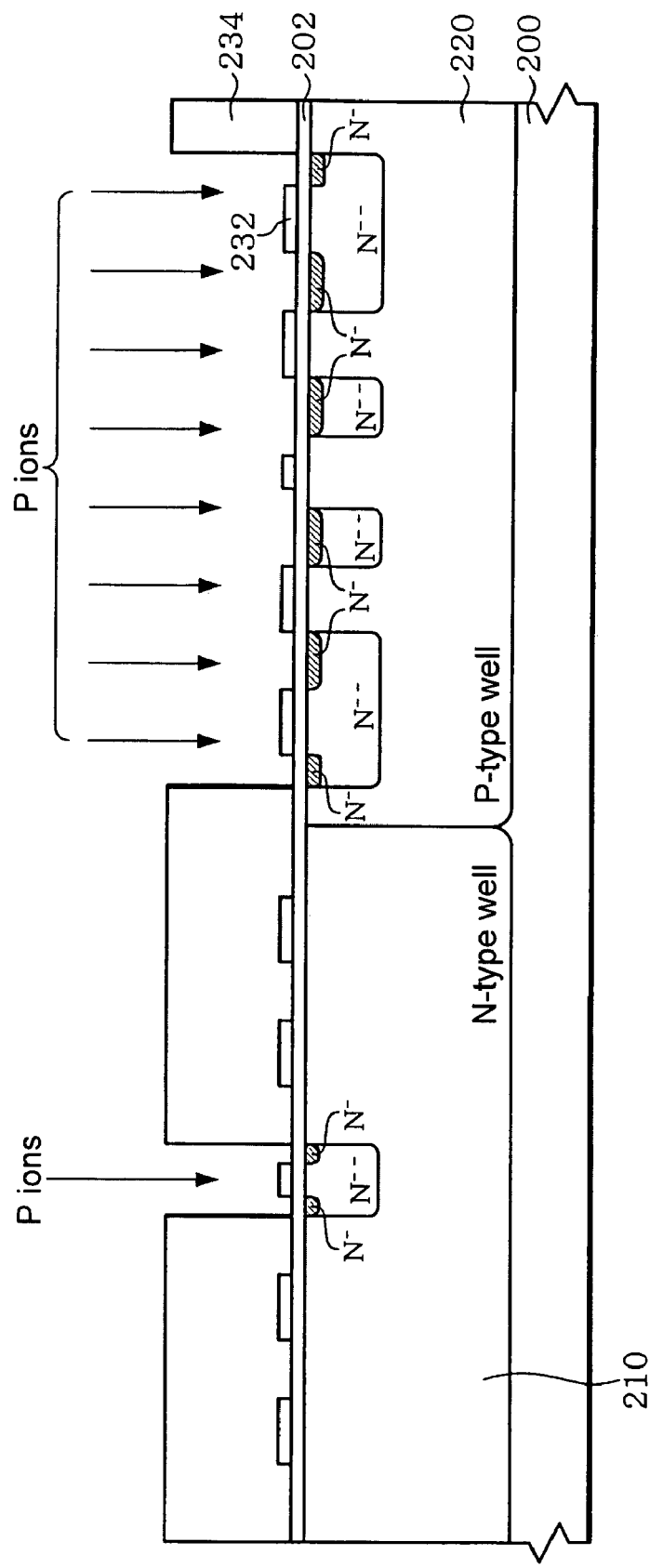
FIG. 24 is an explanatory view of a step of the method for manufacturing a semiconductor device in the embodiment.
Figure 25:
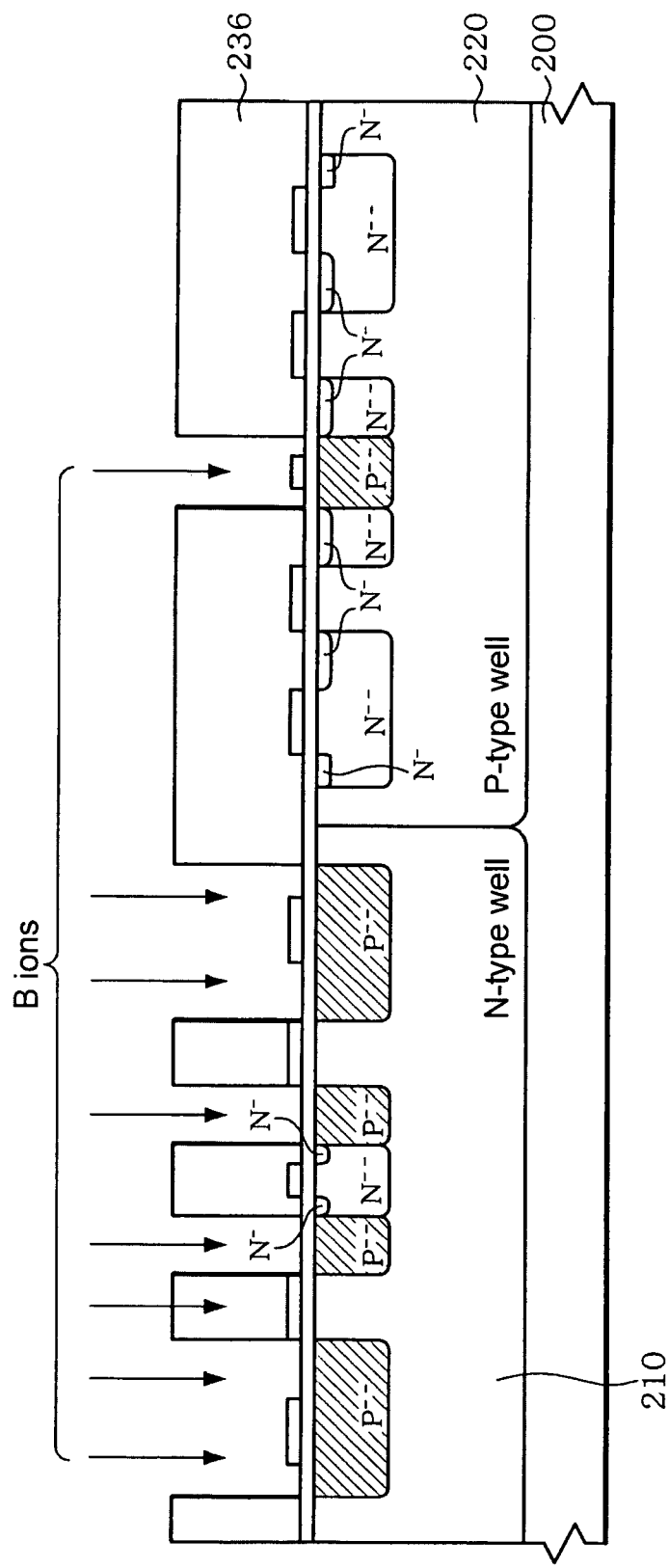
FIG. 25 is an explanatory view of a step of the method for manufacturing a semiconductor device in the embodiment.
Figure 26:
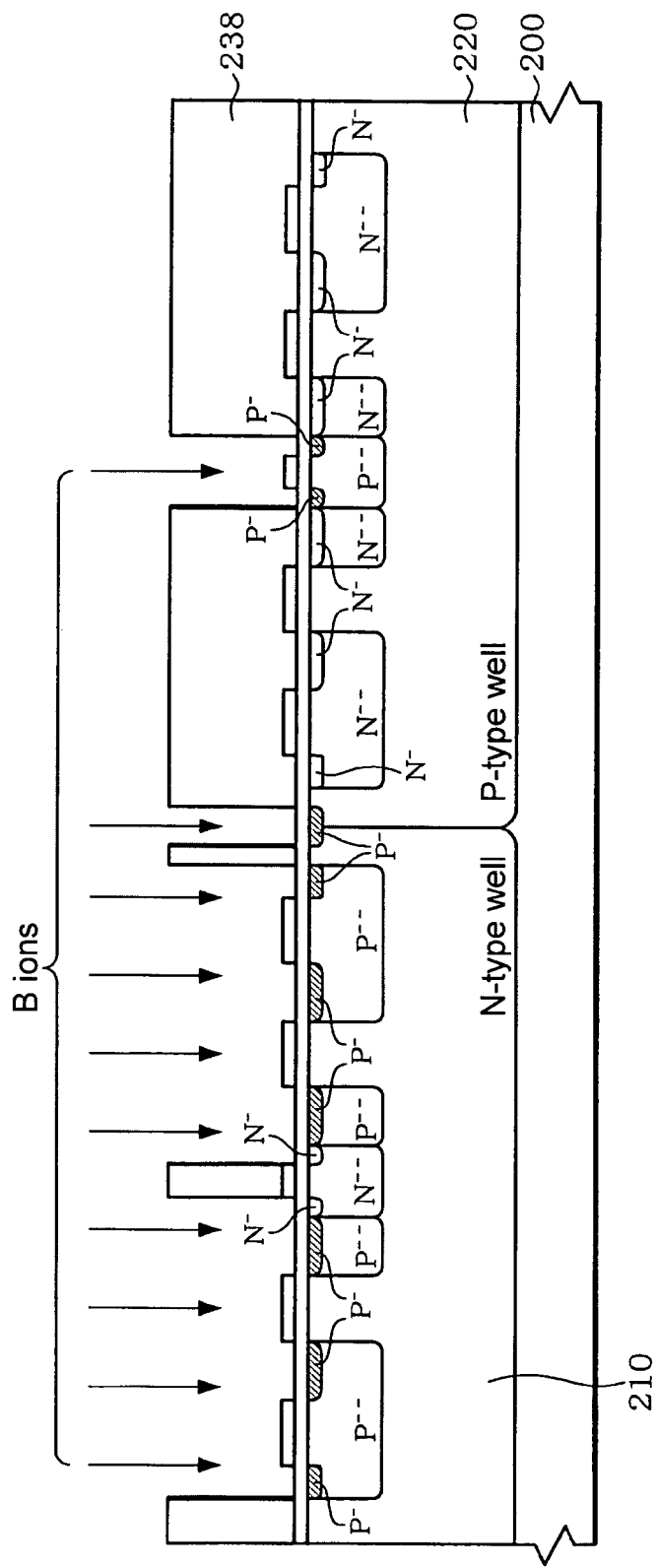
FIG. 26 is an explanatory view of a step of the method for manufacturing a semiconductor device in the embodiment.
Figure 27:
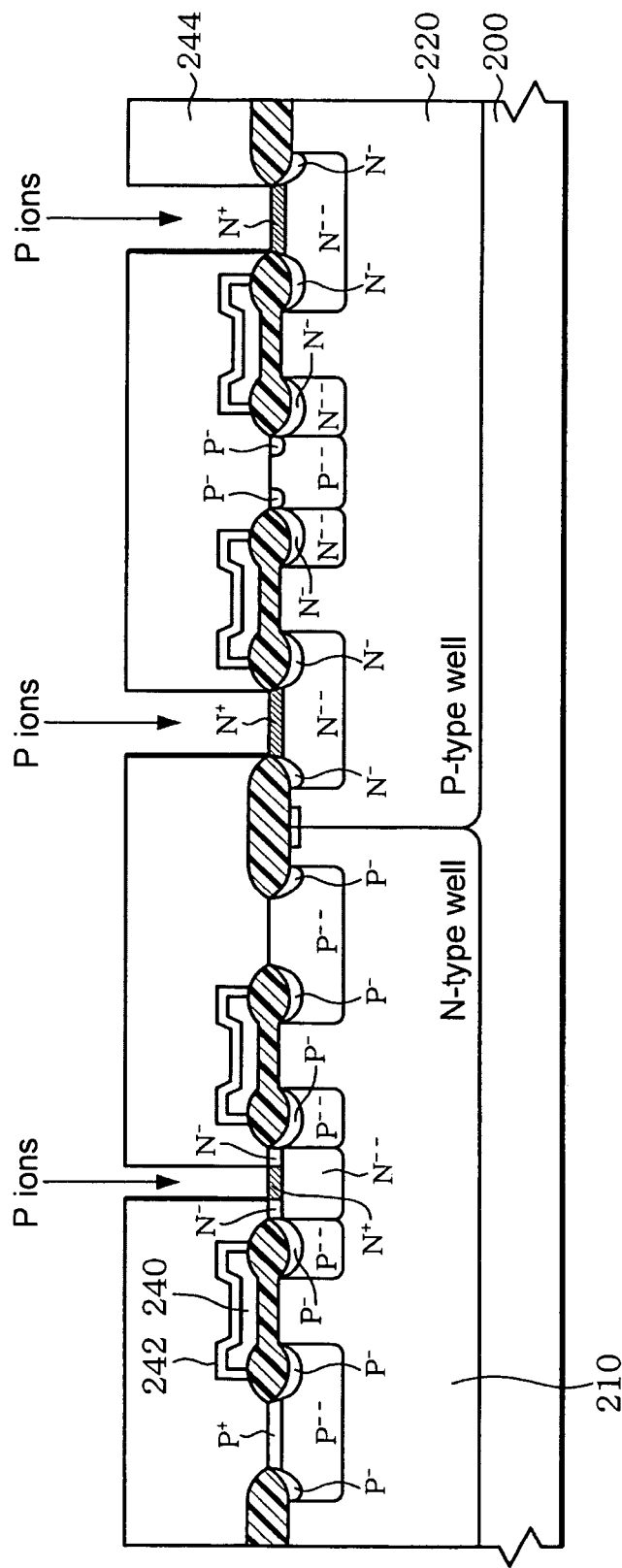
FIG. 27 is an explanatory view of a step of the method for manufacturing a semiconductor device in the embodiment.
Figure 28:
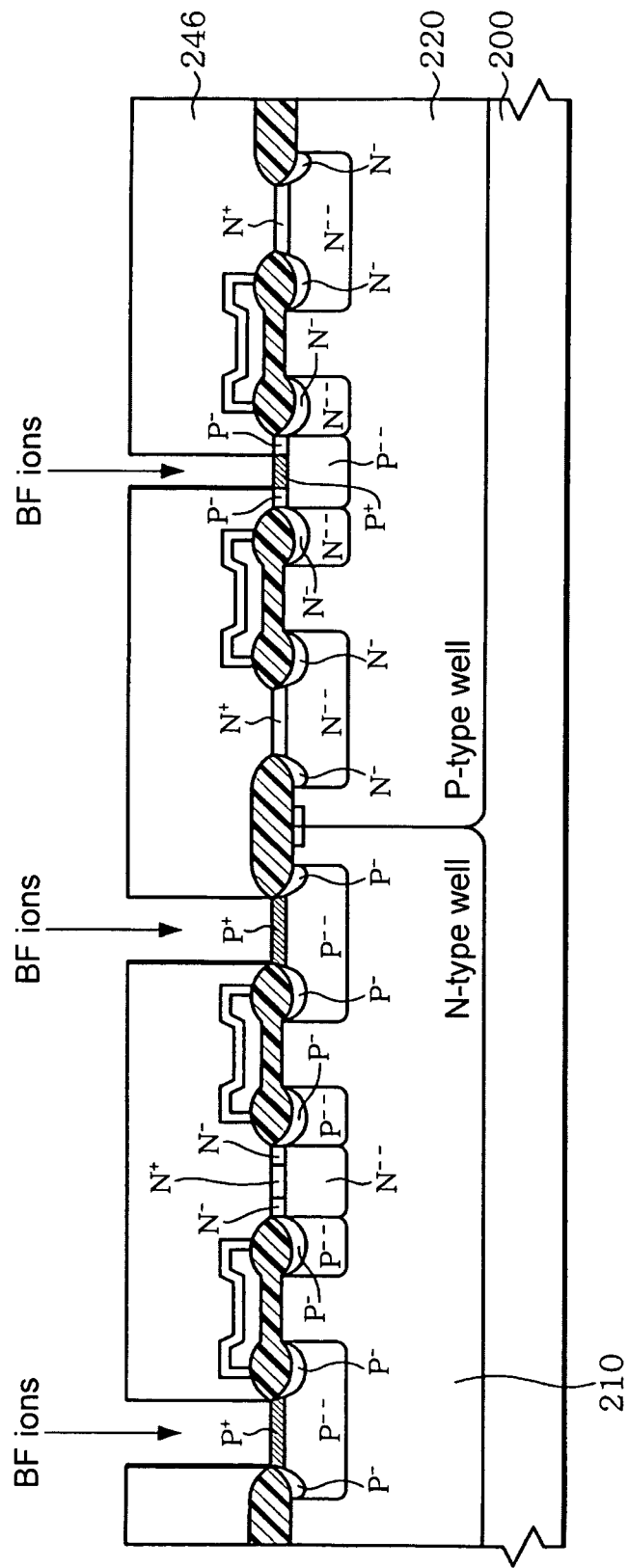
FIG. 28 is an explanatory view of a step of the method for manufacturing a semiconductor device in the embodiment.

Subsequently, the resist layer 230 is removed with a sulfuric acid removal treatment, and after annealing the surface of the semiconductor substrate 200, the depth of the impurity diffusion layer is deepened (refer to FIG. 23). This impurity diffusion layer becomes the diffusion layers 20a, 50a, 50b, and 20b of FIG. 4B, and the diffusion layer 154 of FIG. 12B, and this impurity concentration is $N^{--}$.

Next, a field treatment film 232 and a resist layer are formed in the surface of the semiconductor substrate 200, and after patterning a field region, a patterning is carried out with a resist layer 234 so that a region for forming a diffusion layer as an N-type stopper layer may be opened. Then, for example, phosphorus ions are injected to form diffusion layers which are the first and second stopper layers (refer to FIG. 24). These diffusion layers become the diffusion layers 32a, 60a, 60b, and 32b of FIG. 4B and the diffusion layer 158b of FIG. 12B, and this impurity concentration is $N^-$.

Next, after removing the resist layer 234 with a sulfuric acid removal treatment, a patterning is carried out with the resist layer 236 so that a region for forming a P-type impurity diffusion layer may be opened. Subsequently, for example, boron ions are injected to form a P-type impurity diffusion layer (refer to FIG. 25). This impurity diffusion layer becomes the impurity diffusion layer 54 of FIG. 4B, and the diffusion layers 120a, 120b, 150a and 150b of FIG. 12B, and this impurity concentration is $P^{--}$.

Next, after removing the resist layer 236 with a sulfuric acid removal treatment, a patterning is carried out with the resist layer 238 so that a region for forming a P-type diffusion layer may be opened. Subsequently, for example, boron ions are injected to form a P-type diffusion layer (refer to FIG. 26). This diffusion layer becomes the diffusion layers 58a and 58b of FIG. 4B and the diffusion layers 132a and 132b of FIG. 12B, and this impurity concentration is P$^-$.

Subsequently, after removing the resist layer 238 with a sulfuric acid removal treatment and carrying out field oxidation, the gate electrode 240 composed of polycrystal silicon is formed. Then, in the surface of this gate electrode 240, a protective film composed of tungsten 242 is formed. Then, a patterning is carried out with the resist layer 244 so that a region for forming the N-type high concentration impurity diffusion layer may be opened. Subsequently, for example, phosphorus ions are injected to form the N-type high concentration impurity diffusion layer (refer to FIG. 27). This high concentration impurity diffusion layer becomes the high concentration impurity diffusion layers 30a and 30b of FIG. 4B and the high concentration impurity diffusion layer 152 (162a, 162b) of FIG. 12B, and this impurity concentration is N$^+$.

Then, the resist layer 244 is removed, and a patterning is carried out with the resist layer 246 so that a region for forming an N-type high concentration impurity diffusion layer may be opened. Subsequently, for example, boron fluoride ions (BF$_2^+$) are injected to form a P-type high concentration impurity diffusion layer (refer to FIG. 28). This high concentration impurity diffusion layer becomes the high concentration impurity diffusion layer 52 (62a, 62b) of FIG. 4B and the high concentration impurity diffusion layers 130a and 130b of FIG. 12B, and this impurity concentration is P$^+$.

Subsequently, the resist layer 246 is removed to form a wiring layer to be electrically coupled with the high concentration impurity diffusion layer and the gate electrode. Since the step for forming this wiring layer is well known, the description thereof will be omitted. In this way, two transistors formed in the P-type well 220 have the same structure as that of the two transistors shown in FIG. 4B. Moreover, two transistors formed in the N-type well 210 have the same structure as that of the two transistors shown in FIG. 12B.

In addition, the invention is not limited to the above-described embodiments, and various modifications can be implemented within the spirits and scope of the invention. For example, the present invention is not limited to the ones applied to the drive for the above-described fluorescent display tube, but can be applied to the drive for liquid crystal display panels, electroluminescence, and plasma display devices. Moreover, for example, the invention can be applied not only to semiconductor devices including transistors for driving display devices but also applied to semiconductor devices including other high break down voltage transistors, such as transistors configuring a level shifter.

Moreover, in the above-described embodiments, the examples in which the first electric conductivity type is P-type and the second electric conductivity type is N-type have been described, however, the electric conductivity types may be the other way around. Furthermore, needless to say the layer structure or plane structure of semiconductor devices can take structures different from those of the above-described embodiments depending on the device design.

Moreover, in the invention concerning the dependent claim of the present invention, configurations of omitting a part of the configuration requirements of the depended claim may be made. Moreover, a principal part of the invention concerning one independent claim of the present invention can be also made dependent on other independent claims.

What is claimed is:

1. A semiconductor device comprising:
    a semiconductor substrate;
    a first gate electrode of a first transistor; and
    a second gate electrode of a second transistor,
    the semiconductor substrate including:
        a first channel region of the first transistor, the first channel region having a first conductivity type;
        a second channel region of the second transistor, the second channel region having the first conductivity type;
        a first diffusion layer formed between the first channel region and the second channel region, the first diffusion layer having the first conductivity type;
        a second diffusion layer formed on the first diffusion layer, the second diffusion layer having the first conductivity type.

2. The device according to claim 1,
    an impurity concentration of the first diffusion layer being lower than an impurity concentration of the second diffusion layer.

3. The device according to claim 2,
    the semiconductor substrate further including:
        a third diffusion layer formed between the first channel region and the first diffusion layer, the third diffusion layer having a second conductivity type;
        a fourth diffusion layer formed between the second channel region and the first diffusion layer, the third diffusion layer having the second conductivity type.

4. The device according to claim 3,
    the semiconductor substrate further including:
        a fifth diffusion layer formed on the third diffusion layer, the fifth diffusion layer having the second conductivity type;
        a sixth diffusion layer formed on the fourth diffusion layer, the sixth diffusion layer having the second conductivity type.

5. The device according to claim 4,
    an impurity concentration of the fifth diffusion layer being lower than an impurity concentration of the third diffusion layer;
    an impurity concentration of the sixth diffusion layer being lower than an impurity concentration of the fourth diffusion layer.

6. The device according to claim 5,
    the semiconductor substrate further including:
        a seventh diffusion layer formed adjacent to the fifth diffusion layer, the seventh diffusion layer having the first conductivity type;
        an eighth diffusion layer formed adjacent to the sixth diffusion layer, the eighth diffusion layer having the first conductivity type.

7. The device according to claim 6,
    the impurity concentration of the first diffusion layer being lower than an impurity concentration of the seventh diffusion layer;
    the impurity concentration of the first diffusion layer being lower than an impurity concentration of the eighth diffusion layer.

8. The device according to claim 7, further comprising at least one back gate electrode formed on the second diffusion layer.

9. The device according to claim 8, further comprising:
    at least one source electrode formed above the substrate, the at least one source electrode being away from the at least one back gate electrode, the at least one source electrode being formed between the first gate electrode and the second gate electrode.

10. The device according to claim 9,
the semiconductor substrate further including:
a ninth diffusion layer formed below the source electrode, the ninth diffusion layer having the second conductivity type.

11. The device according to claim 10,
the semiconductor substrate further including:
a tenth diffusion layer formed below the ninth diffusion layer, the tenth diffusion layer having the second conductivity type.

12. The device according to claim 11,
the semiconductor substrate further including:
an eleventh diffusion layer formed adjacent to an edge of the ninth diffusion layer, the eleventh diffusion layer having the second conductivity type;
a twelfth diffusion layer formed adjacent to another edge of the ninth diffusion layer, the twelfth diffusion layer having the second conductivity type.

13. The device according to claim 12, further comprising:
a first LOCOS film formed on the fifth diffusion layer;
a second LOCOS film formed on the sixth diffusion layer.

* * * * *

UNITED STATES PATENT AND TRADEMARK OFFICE
CERTIFICATE OF CORRECTION

PATENT NO. : 7,495,297 B2
APPLICATION NO. : 12/009160
DATED : February 24, 2009
INVENTOR(S) : Atsushi Ishikawa It is certified that error appears in the above-identified patent and that said Letters Patent is hereby corrected as shown below:

Col. 6, Line 23    "input signal 11" should be --input signal I1--.

Col. 6, Lines 24-25    "input signal 12" should be --input signal I2--.

Col. 6, Lines 25-26    "input signals 11 and 12" should be --input signals I1 and I2--.

Signed and Sealed this

Thirteenth Day of October, 2009

David J. Kappos
*Director of the United States Patent and Trademark Office*